United States Patent
Kassas et al.

(10) Patent No.: US 8,122,238 B2
(45) Date of Patent: Feb. 21, 2012

(54) MULTI-CHANNEL ALGORITHM INFRASTRUCTURE FOR PROGRAMMABLE HARDWARE ELEMENTS

(75) Inventors: Zaher Kassas, Austin, TX (US); James M. Lewis, Austin, TX (US)

(73) Assignee: National Instruments Corporation, Austin, TX (US)

(*) Notice: Subject to any disclaimer, the term of this patent is extended or adjusted under 35 U.S.C. 154(b) by 979 days.

(21) Appl. No.: 12/104,901

(22) Filed: Apr. 17, 2008

(65) Prior Publication Data

US 2008/0263343 A1    Oct. 23, 2008

Related U.S. Application Data

(60) Provisional application No. 60/913,433, filed on Apr. 23, 2007.

(51) Int. Cl.
*G06F 1/24* (2006.01)
*G06F 9/00* (2006.01)

(52) U.S. Cl. ............ 713/100; 713/1; 717/109; 717/110; 717/113

(58) Field of Classification Search .............. 713/1, 100; 717/109, 110, 113

See application file for complete search history.

(56) References Cited

U.S. PATENT DOCUMENTS

| | | | |
|---|---|---|---|
| 5,309,556 A | 5/1994 | Sismilich |
| 5,497,498 A | 3/1996 | Taylor |
| 5,535,342 A | 7/1996 | Taylor |
| 5,541,849 A | 7/1996 | Rostoker et al. |
| 5,583,749 A | 12/1996 | Tredennick et al. |
| 5,603,043 A | 2/1997 | Taylor et al. |
| 5,638,299 A | 6/1997 | Miller |
| 5,652,875 A | 7/1997 | Taylor |
| 5,684,980 A | 11/1997 | Casselman |
| 5,737,235 A | 4/1998 | Kean et al. |
| 6,219,628 B1 | 4/2001 | Kodosky et al. |

(Continued)

FOREIGN PATENT DOCUMENTS

WO    94 10627    5/1994

(Continued)

OTHER PUBLICATIONS

"FIR Compiler v4.0 Product Specification"; Xilinx LogiCORE; Jun. 27, 2008; 86 pages.

(Continued)

*Primary Examiner* — Chun Cao
*Assistant Examiner* — Jaweed A Abbaszadeh
(74) *Attorney, Agent, or Firm* — Meyertons Hood Kivlin Kowert & Goetzel, P.C.; Jeffrey C. Hood; Joel L. Stevens

(57) ABSTRACT

System and method for implementing multi-channel operations in a programmable hardware element (PHE). A hardware configuration program, including a processing function, inputs and outputs of the processing function, a plurality of channels, and channel scanning functionality for the plurality of channels, is specified. A PHE is configured with the hardware configuration program, including implementing the processing function and the channel scanning functionality on the PHE. A respective state and configuration of each of the plurality of channels is stored in a memory of the PHE to enable logic-sharing between each of the plurality of channels. The PHE is operated, including performing channel scanning on the plurality of channels, and updating the configuration of one or more of the channels in the memory of the PHE without interrupting the channel scanning, without taking any of the channels offline, and/or without interrupting a continuity of an output of the PHE.

17 Claims, 15 Drawing Sheets

U.S. PATENT DOCUMENTS

| | | | | |
|---|---|---|---|---|
| 6,823,283 | B2 | 11/2004 | Foote et al. | |
| 7,085,670 | B2 | 8/2006 | Odom et al. | |
| 7,110,358 | B1* | 9/2006 | Clinton et al. | 370/235 |
| 7,254,512 | B2 | 8/2007 | Odom | |
| 7,449,915 | B2* | 11/2008 | Schmit et al. | 326/38 |
| 7,598,768 | B1* | 10/2009 | Tetzlaff et al. | 326/38 |
| 7,599,299 | B2* | 10/2009 | Goetting et al. | 370/241 |
| 7,657,861 | B2* | 2/2010 | Vorbach et al. | 716/101 |
| 2003/0196187 | A1* | 10/2003 | Kodosky et al. | 717/109 |
| 2004/0093438 | A1* | 5/2004 | Odom | 710/22 |
| 2006/0248317 | A1* | 11/2006 | Vorbach et al. | 712/221 |
| 2007/0200594 | A1* | 8/2007 | Levi et al. | 326/38 |

FOREIGN PATENT DOCUMENTS

| | | |
|---|---|---|
| WO | 94 15311 | 7/1994 |

OTHER PUBLICATIONS

Chen, et al., "Software Environment for WASMII: A Data Driven Machine with a Virtual Hardware", Field Programmable Logic Architectures, Synthesis, and Applications, 4th International Workshop on Field-Programmable Logic and Applications, Berlin, Germany, 1994, 12 pages.

Edwards, et al., "Software acceleration using programmable hardware devices", IEEE Proceedings: Computers and Digital Techniques, vol. 143, No. 1, Jan. 1996, pp. 55-63.

Leeser, et al, "High Level Synthesis and Generating FPGAs with the BEDROC System", Journal of VLSI Signal Processing, vol. 6, No. 2, Aug. 1993, pp. 191-214.

Ade, et al, "Hardware-Software Codesign with GRAPE", Proceedings of the 6th IEEE International Workshop on Rapid System Prototyping, pp. 40-47, 1995.

Lauwereins, et al., "GRAPE-II: A System-Level Prototyping Environment for DSP Applications", Computer, vol. 28, Issue 2, pp. 35-43, Feb. 1995.

Lysaght, et al., "A Simulation Tool for Dynamically Reconfigurable Field Programmable Gate Arrays", IEEE Transactions on Very Large Scale Integration Systems, vol. 4, Issue 3, pp. 381-390, Sep. 1996.

De Coster, "GRAPE-II: An Introduction", Automatic Control and Computer Architectures Department, Katholieke Universiteit Leuven, Belguim, Feb. 22, 1996, retrieved from Internet on Oct. 6, 1999: http://www.esat.kuleuven.ac.be/acca, 25 pages.

Wenban, et al., "A Software Development System for FPGA-Based Data Acquisition Systems", Proceedings of the IEEE Symposium on FPGAs for Custom Computing Machines, Apr. 1996, pp. 28-37.

Petronino, et al., "An FPGA-Based Data Acquisition System for a 95 GHz W-Band Radar", IEEE International Conference on Acoustics, Speech, and Signal Processing, vol. 5, Apr. 1997, pp. 4105-4108.

Boulay, et al., "A High Throughput Controller for a 256-Channel Cardiac Potential Overlapping System", Canadian Conference on Electrical and Computer Engineering, vol. 1, Sep. 1995, pp. 539-542.

* cited by examiner

|  | Resources | | | |
|---|---|---|---|---|
| # of PID Loops | Slices | % | Multipliers | % |
| Legacy FPGA PID | 1 | 546 | 11% | 3 | 7% |
| Legacy FPGA PID | 4 | 2518 | 50% | 12 | 28% |
| Legacy FPGA PID | 8 | 4671 | 92% | 30 | 70% |
| New FPGA PID | 1 | 457 | 9% | 3 | 7% |
| New FPGA PID | 4 | 884 | 18% | 4 | 10% |
| New FPGA PID | 8 | 890 | 18% | 4 | 10% |
| New FPGA PID | 32 | 957 | 19% | 4 | 10% |
| New FPGA PID | 128 | 1198 | 24% | 4 | 10% |
| New FPGA PID | 256 | 1488 | 30% | 4 | 10% |

FIG. 20

MULTI-CHANNEL ALGORITHM INFRASTRUCTURE FOR PROGRAMMABLE HARDWARE ELEMENTS

PRIORITY DATA

This application claims benefit of priority to U.S. Provisional Application Ser. No. 60/913,433, titled "Multi-Channel Algorithm Infrastructure for Programmable Hardware Elements", filed Apr. 23, 2007, whose inventors are Zaher Kassas and James M. Lewis.

FIELD OF THE INVENTION

This invention relates generally to configuring programmable hardware elements, and more particularly, to implementing multi-channel functionality on a programmable hardware element.

DESCRIPTION OF THE RELATED ART

Scientists and engineers often use measurement systems to perform a variety of functions, including measurement of physical phenomena or a unit under test (UUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a PXI Express bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis.

The computer system may generate digital signals that are provided to one or more Digital-to-Analog converters (DACs) in the DAQ device. The DACs may convert the digital signal to an output analog signal that may be used, for example, to stimulate a UUT.

The DAQ system(s) or instrumentation devices can include filtering and PID control functions, which may be implemented in a field programmable gate array (FPGA). Most such implementations feature single-channel operations, while multi-channel operations, when available, oftentimes require undesirable compromises, e.g., with respect to resource sharing, such as schemes to load coefficients at run-time, (e.g. Xilinx FIR Compiler v3.0), limitations on resources based on loop frequency, and so forth. Thus, improved systems and methods for implementing multi-channel operations in programmable hardware are desired.

Other corresponding issues related to the prior art will become apparent to one skilled in the art after comparing such prior art with the present invention as described herein.

SUMMARY OF THE INVENTION

Various embodiments are presented below of a system and method for configuring a programmable hardware element (PHE), e.g., a field programmable gate array (FPGA), to perform one or more functions, with support for high channel counts. In one embodiment, a system may be specified to include features for implementing multiple channel processing functionality to support high channel counts. During runtime, a single configuration memory may be used on the PHE to store configuration information. Thus, the configuration information may be updated without having to switch back and forth between two or more instances of configuration memory. In addition, the PHE is not required to be taken "off-line" to update the configuration memory as required in prior art systems.

The system may comprise a host computer system coupled to a device, which includes the PHE. Graphical program development software (e.g., the LabVIEW graphical program development environment provided by National Instruments Corporation) may execute on the host computer, and may be used to create a hardware configuration program (e.g., a LabVIEW program, referred to as a virtual instrument (VI)) that may be used to configure the PHE on the device. The graphical program development software (or other development software) may also be used to create a program that executes on the host during runtime to provide supervisory control of the executing PHE. Thus during runtime of the PHE, the host computer may display a LabVIEW graphical user interface (e.g., the computer may execute a front panel portion of the graphical program) which may be used to control operations on the executing PHE. LabVIEW provides a communication infrastructure that allows the host computer to easily communicate configuration updates to memory on the PHE. As noted above, a single configuration memory may be used for receiving and storing updates. Thus the single configuration memory on the PHE may be updated without interrupting the channel scanning, without taking any of the channels offline, and/or without interrupting a continuity of an output of the programmable hardware element. It should be noted, however, that in other embodiments, other program development environments or technologies may be used as desired, including text-based programming languages, such as C++, JAVA, etc., or tools designed specifically for generating hardware configuration programs.

In one embodiment, the user may first specify a hardware configuration program that can be implemented on a PHE. The hardware configuration program may be specified in a graphical data flow programming environment, such as LabVIEW. Thus the user may create a graphical data flow program, i.e., a plurality of interconnected nodes, to specify the functionality desired on the PHE. The hardware configuration program may be specified to include one or more processing functions, such as a filter or filters, and/or control functions, e.g. PID (proportional integral derivative) control. The user may also specify respective inputs and outputs to/from the processing function or functions, and specify channel scanning functionality to effectively organize the inputs and outputs in a sequence, in effect serializing the inputs with respect to each other, and the outputs with respect to each other, to provide for multi-channel processing functionality of the hardware configuration program. In other words, the hardware configuration program may be configured with a plurality of input channels to receive digitized data from a plurality of input sources, e.g., from one ADC converter or a plurality of ADC converters, and with a plurality of corresponding output channels.

The user may also specify or create a second program (e.g., a graphical program) that is designed to execute on the host computer during runtime and which may provide a GUI or front panel to the executing PHE. The second program may be useable by the user to change configuration information in the PHE during runtime.

The programmable hardware element may then be configured with the hardware configuration program. In other words, the hardware configuration program may be implemented on the programmable hardware element, including the processing function or functions, the channels, and the channel scanning functionality. Configuring the PHE may include storing respective state of each of the plurality of channels in a state memory of the programmable hardware element, to enable logic-sharing between each of the plurality of channels. The state memory is preferably not user-accessible and may use a circular buffering scheme tied to the channel being processed. Configuring the PHE may also include implementing a configuration memory for storing configuration information for each of the channels. The configuration memory is preferably a random access memory that can be updated from the host The device (or the PHE on the device) may then be executed/operated. During runtime, i.e., during operation/execution of the PHE, channel scanning may be performed on the plurality of channels to receive the inputs in a sequence (or in a serial fashion) on the plurality of channels. In other words, input data may be provided from each of the channels in turn to the processing function. The PHE may perform the processing function or functions, e.g., the filtering function and/or PID function, on the data received from each of the channels. Further, the host computer may present a GUI that enables a user to control operations on the executing PHE.

Updated configuration information, e.g., filter coefficients, of the processing function may be provided to update the processing function executing on the PHE. The provision of the configuration information may be implemented in the second graphical program, and thus the configuration information may be provided programmatically to the configuration memory for use by the processing function. Alternatively, the user may use the GUI to interactively specify the configuration information during runtime. The configuration information may be updated in the single configuration memory on the PHE during runtime without interrupting the channel scanning, without taking any of the channels offline, and/or without interrupting a continuity of an output of the programmable hardware element. In other words, runtime update of configuration information may be performed in a "glitch free" manner in a single instance of internal configuration memory, without requiring a double buffering scheme as in the prior art. For example, coefficient values may be stored in the single configuration memory at runtime as described above without interrupting the PHE execution.

Thus, as described above, the PHE may process the inputs and outputs of the processing object as sequential inputs in a channel scanning scheme, while caching the state of each channel to enable logic-sharing between the channels. Configuration information corresponding to the function or functions that are being executed may be updated at run-time without interrupting the channel scan or disturbing the continuity of the output or outputs.

The LabVIEW graphical programming language offers an add-on PHE (e.g., LabVIEW-FPGA®) module that enables a user to construct a program that runs on a PHE. This environment provides several novel features related to its graphical interface and methods of communicating with hardware targets. As previously mentioned, resource sharing solutions in multi-channel hardware implementations do exist, including schemes to load coefficients at run-time, (e.g. Xilinx FIR Compiler v3.0), these solutions typically require a double buffering scheme to implement a glitch-free reload, and provide no external communication mechanism to manage loading new configuration data into the processing component. Accordingly, in some embodiments, a multi-channel algorithm may be configured to require only a single instance of internal configuration memory, while guaranteeing glitch-free updates. The external configuration update mechanism may easily be automated using a graphical programming interface, e.g. the LabVIEW FPGA communication infrastructure, to provide scaling and formatting functions that run on the host computer (e.g., a desktop PC), to insure that the end user can interact with the multi-channel processing function through a conventional graphical user interface, e.g. a conventional LabVIEW graphical user interface.

The multi-channel processing paradigm may also be integrated with "scan" I/O configured, for example, in compact reconfigurable I/O (NI cRIO) modules. The I/O may be provided in a streaming multiplexed fashion, as opposed to simultaneous sampling, which provides all I/O channel updates in parallel, and the processing objects may accept this streaming data without requiring any buffering.

One set of configuration storage mechanisms may also allow optimizations to reduce state storage requirements (to minimize latency and increase the possible channel count for a given loop rate) by storing configuration data independently for each channel. Features that require knowledge of previous configuration parameters, such as integration windup and bumpless gain changes for PID control for example, may be implemented to recognize configuration (gain) changes even if those configuration changes are applied while the channel is inactive.

In general, single-channel filtering and PID control functions may be extended to multiple channels in a PHE architecture. This may be accomplished by sharing the logic for a single-channel function among all the channels, while maintaining the channel states and configurations internally in block RAM. The input data may be scalar in nature, and may be scanned through the channel list in a sequential manner. Configuration information may be updated on a per-channel basis (e.g., filter coefficients; and PID gains, output ranges, and set points) without interrupting the functional operation of the channel being configured, and without affecting the operation of other channels in any way.

Furthermore, certain features of the single-channel functions may be made seamlessly available in their multi-channel counterparts. In particular, the system may be designed to allow algorithm "switching" to take place internally in the PID control depending on how certain parameters—such as integration windup, integration off, and bumpless transformation—change. The algorithm "switching" may be configured to operate without interruption even when the same logic is shared across all the channels, while maintaining the channel states and configurations in block RAM, and communicating with the FPGA through a host machine. One set of embodiments may include "asynchronous channel configuration", in which the configuration for a particular channel may be changed on the host machine at any particular rate, while the PID control is processing another channel. Some, but not all of the functions that may be implemented include Butterworth low-pass and high-pass filters, notch filters, and PID control.

A generalized mechanism, which may be automated, for the process of generating a multi-channel counterpart for any given single-channel function block, based on the multi-channel filtering and PID control architecture described above, may be possible and is contemplated. For example, observability for PID control and/or execution highlighting may be implemented, as well as single stepping, single channel stepping, etc.

Overall, many variations to the basic architecture described above are possible, and any and all such variations will be apparent to those skilled in the art.

BRIEF DESCRIPTION OF THE DRAWINGS

The foregoing, as well as other objects, features, and advantages of this invention may be more completely understood by reference to the following detailed description when read together with the accompanying drawings in which:

FIG. 20 is a table of exemplary data showing performance improvements due to the invention, according to one embodiment.

Figure 1:
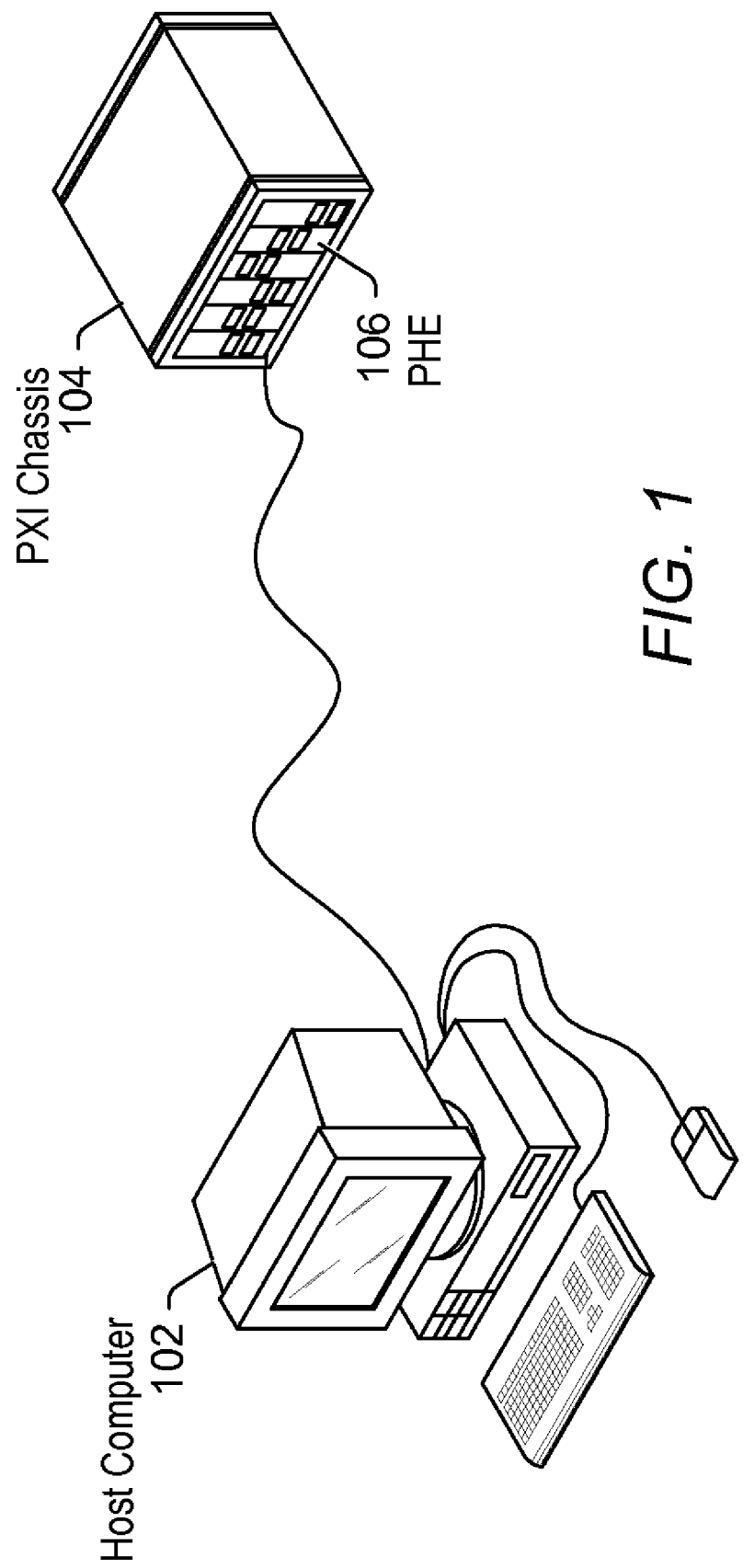
FIG. 1 illustrates an exemplary system that may include a host computer system coupled to a device having a programmable hardware element (e.g., an FPGA) according to one embodiment of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION

Incorporation by Reference:

The following references are hereby incorporated by reference in their entirety as though fully and completely set forth herein:

U.S. Provisional Application Ser. No. 60/913,433, titled "Multi-Channel Algorithm Infrastructure for Programmable Hardware Elements", filed Apr. 23, 2007.

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Graphical Data Flow Program (or Graphical Data Flow Diagram)—A graphical program or diagram comprising a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input the by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

FIG. 1—Exemplary System

FIG. 1 illustrates an exemplary system that may include a host computer system 102 coupled to a device 104/106 having a programmable hardware element (PHE) according to one embodiment of the invention. As shown, the exemplary system may include a computer system 102 coupled to a PXI chassis 104. The PXI chassis may be adapted to receive one or more PXI plug-in cards. At least one of the PXI cards may comprise a card 106 that includes a PHE. Note, however, that the PHE may be included in various other systems, as desired. The PHE may be configurable according to a graphical program (described in more detail below). The graphical program may include a plurality of interconnected nodes (e.g., via wires) where the interconnected nodes indicate functionality of the graphical program.

As shown in FIG. 1, the computer system 102 may include a display device configured to display a graphical program as the graphical program is created and/or executed. The display device may also be configured to display a graphical user interface or front panel of a graphical program during execution of the graphical program. The graphical user interface may comprise any type of graphical user interface, e.g., depending on the computing platform.

The computer system 102 may include at least one memory medium on which one or more computer programs or software components according to one embodiment of the present invention may be stored. The memory medium may store a program development system for creating programs that can be deployed on a programmable hardware element. For example, the memory medium may store a graphical program development system, such as LabVIEW, for creating graphical programs. The memory medium may also store one or more graphical programs which are useable in performing the methods described herein, i.e., the programs may implement embodiments of the present invention. The memory medium may also store operating system software, as well as other software for operation of the computer system. Various embodiments further include receiving or storing instructions and/or data implemented in accordance with the foregoing description upon a carrier medium.

In some embodiments, the computer system 102 may store a graphical program that may be deployed to various target devices or systems, e.g., such as the card 106 in PXI chassis 104, or a PHE included in the PXI chassis itself, or other systems/devices. Alternatively, or additionally, the computer system 102 may execute a first portion of the graphical program and a second portion may be deployed on one or more targets, such as those listed above, among others. The computer system 102 may be coupled to another computer via a network, such as, for example, an Ethernet network, among others. In some embodiments, the computer system 102 may be coupled to the chassis 104 via a network (e.g., the network from above, or a different network) as well. Note that the computer 102, the other computer, and the chassis 104 may be included or excluded from the system as desired. For example, in one embodiment, the system may only include the computer 102 and the chassis 104, coupled locally, or via a network. Alternatively, the system may include just the computer 102 and the other computer connected via a network (or possibly locally). As indicated above, in one embodiment, the system may include all three devices as well as other systems or target devices.

As indicated above, one or more graphical programs may be executed local to or distributed among any of the devices in the system. For example, a graphical program may be distributed among the chassis 104, the card 106, the computer system 102, and/or the other computer system coupled to the various devices via a network. Thus, the system may take on a variety of configurations as desired. Note that the above described layouts and configurations are exemplary only and other embodiments are envisioned.

Figure 2:
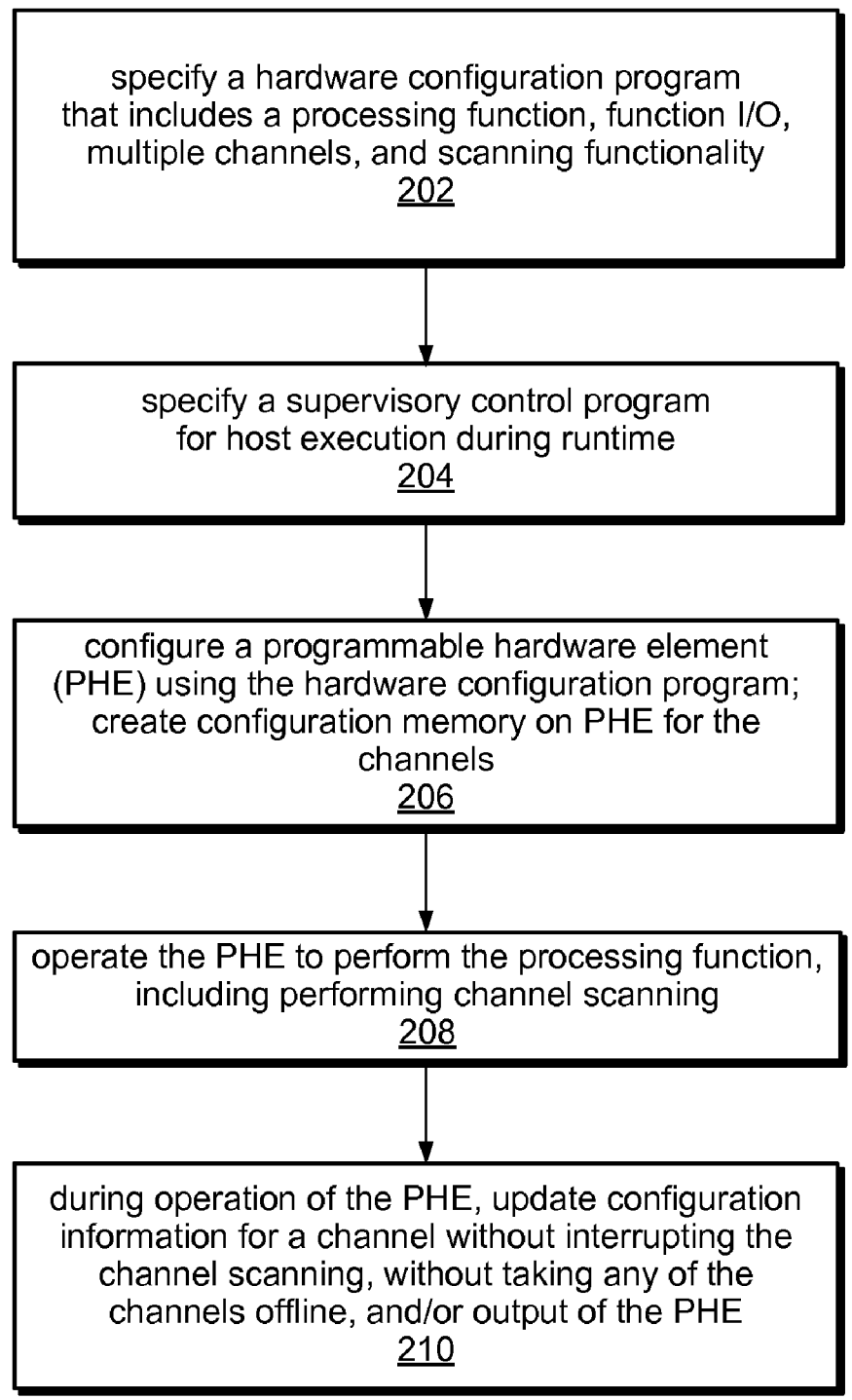
FIG. 2 is a flowchart diagram illustrating operation of the method according to one embodiment.

FIG. 2—Method for Configuring a Programmable Hardware Element

Various embodiments of the invention comprise a system and method for configuring a programmable hardware element, e.g. a field programmable gate array (FPGA), to support high channel counts. Note that while the term FPGA is used in some of the descriptions below, this is not intended to limit the programmable hardware elements contemplated to any particular technology, but rather should be considered as an exemplary example of programmable hardware that may be used to implement embodiments of the invention.

In one set of embodiments, the system may include various features for specifying and implementing multiple channel processing functionality to support high channel counts. For example, during runtime, a single configuration memory may be used on the FPGA to store configuration information. Thus, configuration information may be updated without having to switch back and forth between two or more instances of configuration memory. Further, in preferred embodiments, the FPGA may not be required to be taken "off-line" to update the configuration memory as required in prior art systems.

FIG. 2 is a flowchart illustrating an exemplary method for configuring a programmable hardware element, according to one embodiment. The method of FIG. 2 may be used in conjunction with any of the systems or methods described herein. Various ones of the illustrated steps may be modified, performed in a different order than shown, or omitted entirely, as desired. Additional steps may be added as desired. As shown, the method may operate as follows.

In 202, a hardware configuration program that can be implemented on a PHE (e.g., an FPGA or other type of programmable hardware element) may be specified, e.g., by a user. The hardware configuration program may be specified in a graphical data flow programming environment, such as the LabVIEW graphical development environment, provided by National Instruments Corporation. Thus the user may create a graphical data flow program, i.e., a plurality of interconnected nodes, to specify the functionality desired on the PHE. The graphical program may then be converted or used to create the hardware configuration program, e.g., using methods described in U.S. Pat. No. 6,219,628, which was incorporated by reference above. In various embodiments, the graphical program may be created manually by the user, via a development tool, such as a wizard, or may be generated automatically, e.g., in response to requirements specified by the user, among other development techniques. It should be noted, however, that in other embodiments, other program development environments or technologies may be used as desired, including text-based programming languages, such as C++, JAVA, etc., or tools designed specifically for generating hardware configuration programs.

Specifying the hardware configuration program may include specifying a processing function or multiple processing functions, such as a filter or filters, and/or control functions, e.g. PID (proportional integral derivative) control functions, although other processing functions may be implemented as desired. The specifying may also include specifying respective inputs and outputs to/from the processing function or functions, as well as a plurality of channels, where, for example, the respective inputs and outputs may correspond to respective channels. Channel scanning functionality may also be specified for inclusion in the hardware configuration program, e.g., to provide for multi-channel processing capability, where the respective inputs and outputs may be organized into a sequence through the channel scanning functionality. In other words, the hardware configuration program may be configured with a plurality of channels, each channel comprising at least an input, e.g., to receive digitized data from one ADC converter or a plurality of input sources, e.g., a plurality of ADC converters. The hardware configuration program may further be specified or configured to include outputs corresponding to the plurality of channels.

In one embodiment, the system may include only one ADC converter for a plurality of input channels, which may be the most efficient use case. For example, note that with N converters, data may be acquired in parallel and then multiplexed into the processing functions, but at significant hardware cost, whereas with one ADC converter, the multiplexing may be performed at the I/O and the resulting multi-channel stream may be directly transmitted into the processing function. In some embodiments, this mode may utilize cRIO channel scanning modules, as provided by National Instruments Corporation, although other channel scanning components or modules may be used as desired. Thus, depending on various factors, e.g., economic considerations, the system may utilize one or multiple ADC converters.

In 204, the user may also specify or create a second program (e.g., a graphical program) that is executable on a host computer coupled to the programmable hardware element to update the configuration information for the processing function at run-time. In some embodiments, the second program implements a graphical user interface (GUI) for the programmable hardware element, where the second program is executable (on the host computer) to receive user input to the GUI specifying a configuration update for the processing function, and to update the configuration information on the programmable hardware element accordingly (at run-time). Thus, the second program may provide a GUI or front panel to the executing PHE, and may be useable by the user to change configuration information for or corresponding to the processing function (or functions), in the PHE during runtime.

In 206, the programmable hardware element may then be configured with the hardware configuration program of 202. In other words, the hardware configuration program may be implemented on or deployed to the programmable hardware element, including implementing the processing function or functions and the channel scanning functionality. Configuration of the PHE may further include storing a respective state and configuration information for each of the plurality of channels in a memory of the PHE, where this storing may enable logic-sharing between each of the plurality of channels.

In 208, the device (or the PHE on the device) may be operated/executed to perform the function or functions. During runtime, i.e., during execution of the functions on the PHE, channel scanning may be performed on the plurality of channels, e.g., to receive the inputs and provide the outputs of the plurality of channels in a sequential manner (e.g., where a single processing function is used). In other words, through performing the channel scanning, the inputs of the plurality of channels may be serialized with respect to each other, and the outputs of the plurality of channels may also be serialized with respect to each other. Input data may thereby be provided from each of the channels in turn to the processing function, the PHE may perform the processing function or functions, e.g., the filtering and/or controlling, on the data received from each of the channels, and output data may similarly be provided in turn. In addition, the host computer may present a GUI that enables a user to control operations on the executing PHE, more details of which follow.

In 210, updated configuration information, e.g., filter coefficients, PID parameters, or other configuration information, of the processing function may be provided to update the processing function executing on the PHE. In other words, operating the programmable hardware element may include updating the configuration information for one or more of the channels in the memory of the programmable hardware element.

In some embodiments, the provision of the updated configuration information may be performed by the second program (e.g., the graphical program), and thus the configuration information may be provided programmatically to the processing function. Alternatively, the user may use the GUI to interactively specify the configuration information at or during runtime. The configuration information may be updated in the single configuration memory on the PHE during runtime without interrupting the channel scanning, without taking any of the channels offline, and/or without interrupting a continuity of an output of the programmable hardware element. Note that this runtime update of configuration information is performed in a "glitch free" manner in a single instance of internal configuration memory, without requiring a double buffering scheme as in the prior art. For example, coefficient values may be stored in the single configuration memory at runtime as described above without interrupting the PHE execution/operation.

Described more generally, updating configuration information for the processing function may include executing the second program on the host computer system concurrently with the operation of the programmable hardware element, where executing includes the second program providing a configuration update for the processing function to the programmable hardware element. Moreover, in some embodiments, where the second program implements a graphical user interface (GUI) for the programmable hardware element, updating configuration information for the processing function may include receiving user input to the GUI specifying the configuration update, and providing a configuration update for the processing function to the programmable hardware element may include the second program providing the specified configuration update to the programmable hardware element. This updating may be performed in an iterative manner, e.g., multiple times during operation of the PHE.

In one set of embodiments, a multi-channel PHE processing object, e.g. Butterworth IIR (infinite impulse response) filter, notch IIR filter, and/or PID (proportional integral derivative) control (or any other multi-channel processing object or function), may be implemented with an interface, and any of various methods of communicating individual channel configuration changes may be implemented through or via that interface. In general, the processing object may be provided with methods for glitch-free updates of independent channel configuration information on the PHE in a graphical environment. For example, multi-channel operations in hardware may be optimized and implemented through a novel interface in a graphical environment, e.g. in LabVIEW. Thus, a processing object may be designed and implemented with one or more methods for glitch-free updates of independent channel configuration information on a PHE (e.g., in a graphical environment).

Figure 3:
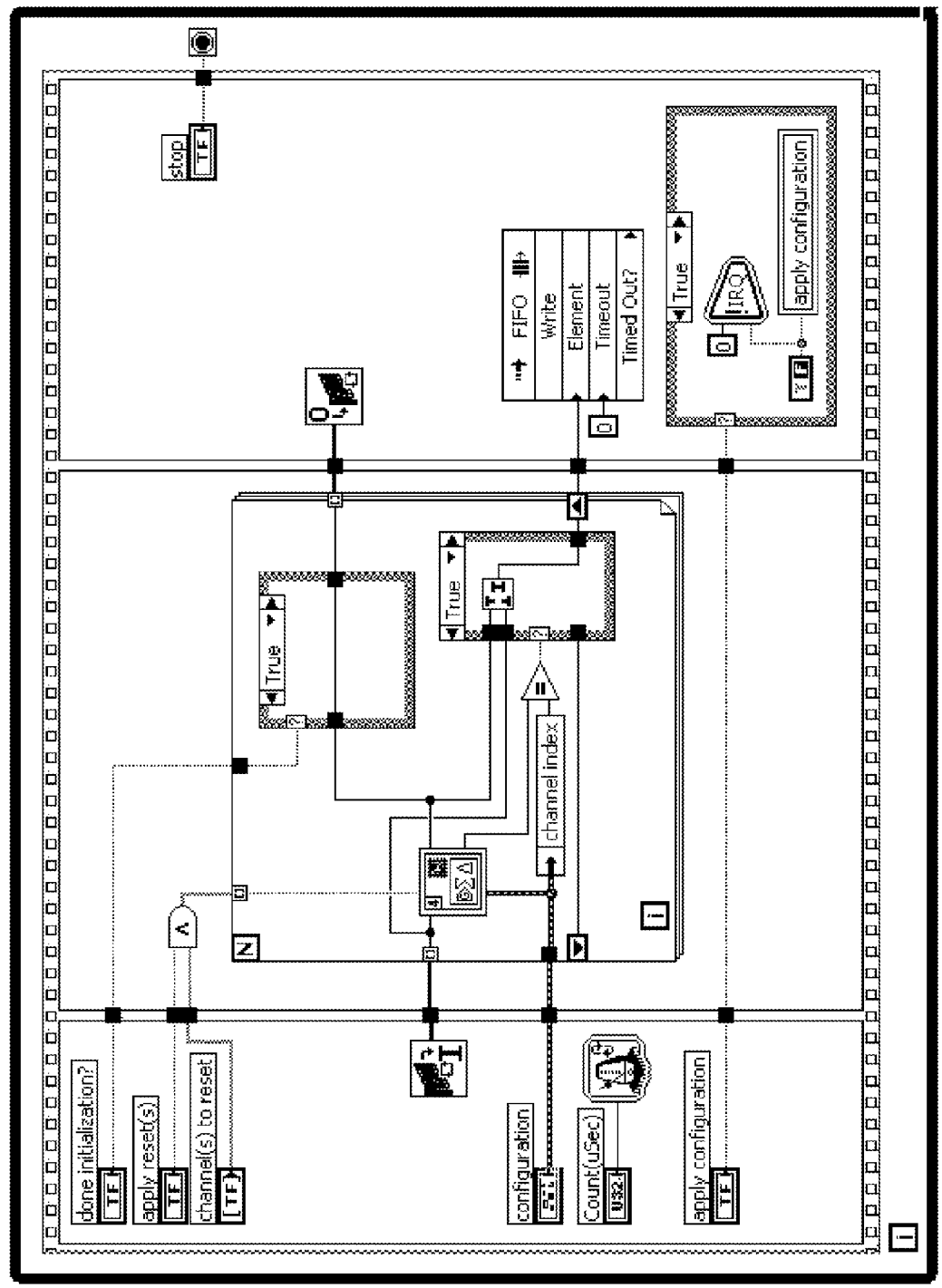
FIG. 3 illustrates a typical user-created target program targeted to execute on an FPGA, passing multiple channels of data to a PID processing function in a host program.
Figure 4A:
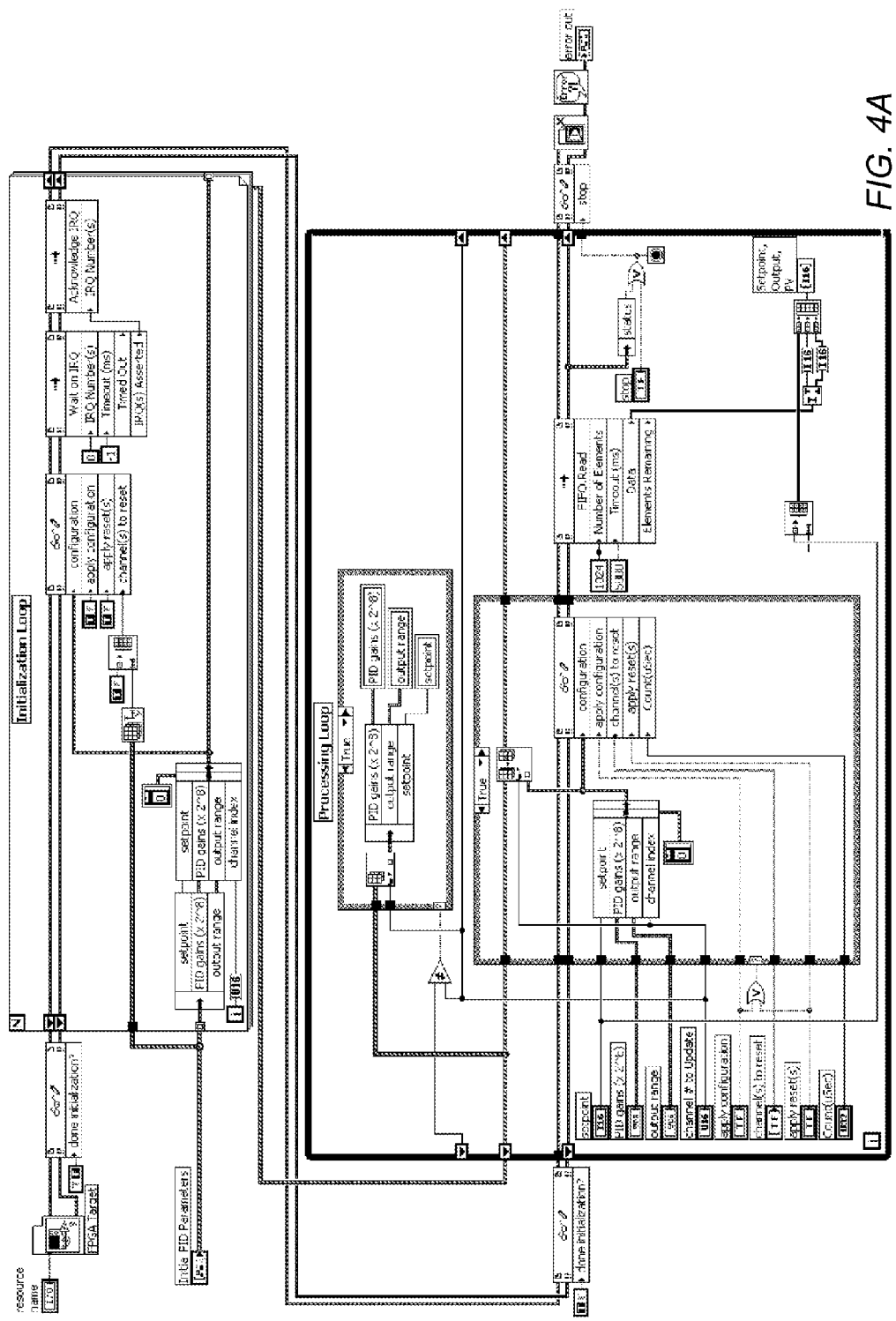
FIG. 4A illustrates a typical user-implemented supervisory control loop program targeted for execution on a controller, and configured to provide configuration data to the multi-channel FPGA program of FIG. 3, and to monitor inputs and outputs to the FPGA target program.

FIGS. 3 and 4A/4B—Exemplary Graphical Programs and Front Panel

Figure 4B:
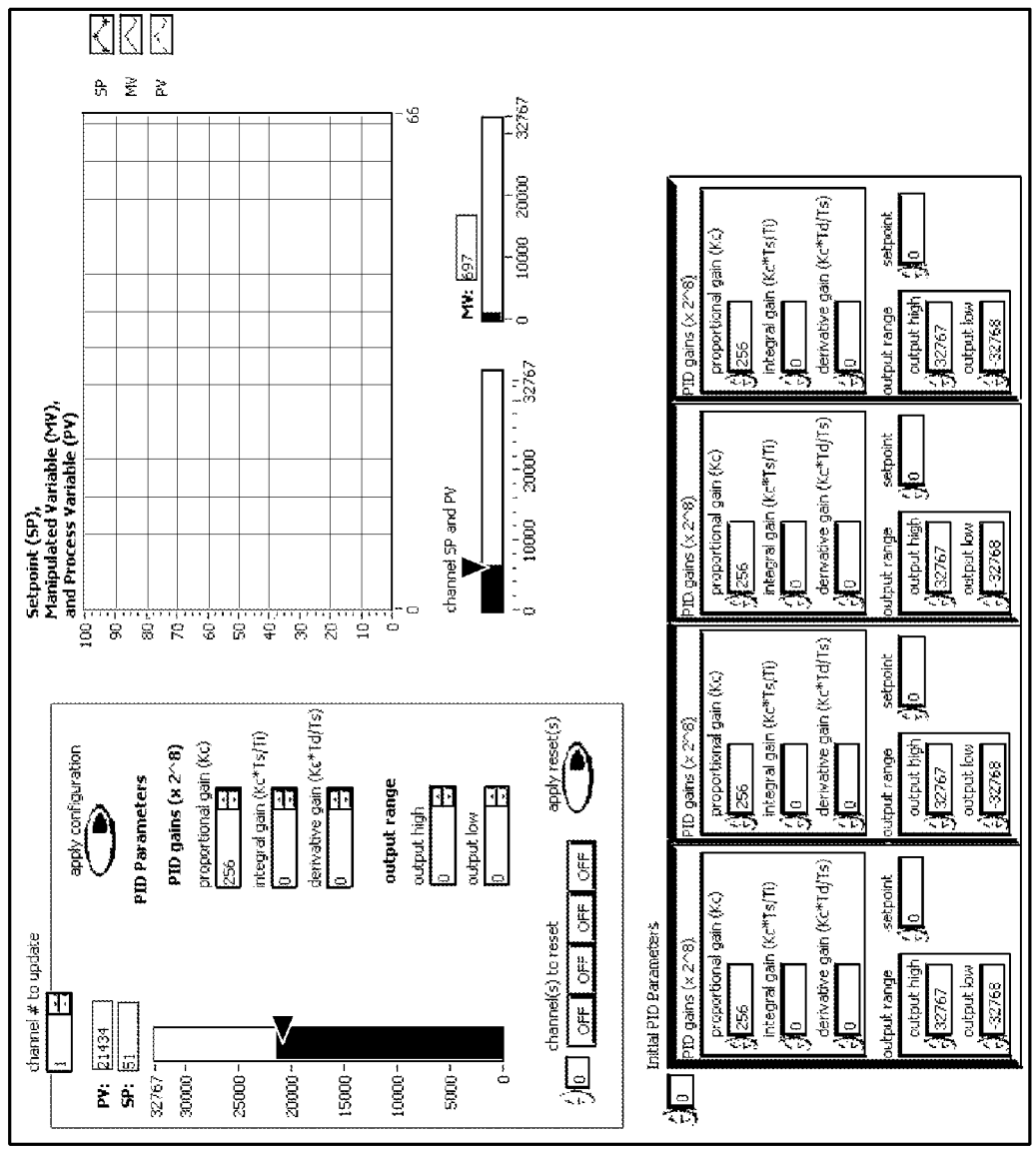
FIG. 4B illustrates a typical graphical user interface (GUI) for the user-implemented supervisory control loop program of FIG. 4A.

FIGS. 3 and 4A/4B illustrate exemplary graphical programs (block diagrams), also referred to as virtual instruments (VIs), and a front panel (GUI), according to one embodiment. More specifically, the graphical programs implement a PID controller application that utilizes a PHE, e.g., a field programmable gate array (FPGA), where FIG. 3 illustrates a typical user-created program or VI that may run on the PHE, e.g., an FPGA target program, and that is executable to pass multiple channels of data to host program executing on a controller coupled to the PHE, e.g., on a real-time or desktop processor. FIG. 4A illustrates an exemplary host program or VI that may be configured to receive the multiple channels of data from the target program and determine values for PID parameters for controlling a process or component. FIG. 4B illustrates a corresponding front panel or GUI for the PID application.

As may be seen, the host VI of FIG. 4A includes two loops: an initialization loop and a processing loop, so labeled. In the initialization loop the user may set a desired initial configuration for all the channels on a channel per channel basis. In this particular embodiment, the configuration is a cluster of the following elements: set point, PID gains (proportional gain, integral gain, and derivative gain), and output range (high and low). Once the PID channels are initialized, the host VI sets the "initialization done" Boolean to true indicating that all the channels are configured with the desired initial values. Consequently, the user may adjust/tune or reset the configuration for any channel(s) through the processing loop. Thus, the processing loop may serve as a supervisory control loop that provides configuration data to the multi-channel (e.g., n channels) PHE function and monitoring of inputs and outputs of the processing function as required. This loop may also include any scaling and unit conversions necessary to present the information in a user-friendly format. Management of the n channels of configuration data may also be implemented at this level for presentation purposes. Such tuning/resetting may take place while the PID code is executing on the FPGA target, i.e. without taking the code off-line. Moreover, since the FPGA loop rates are typically higher than the communication rate between the host and the FPGA target, if the user tunes one (or more) channel while the FPGA is executing another set of channels, the new configuration may be stored in the appropriate memory locations (block RAM) on the FPGA target until that particular channel's turn comes, upon which the gains may be applied while guaranteeing bumpless transfer from the old set of gains to the new set.

In this embodiment, the FPGA target VI initially holds the outputs of all the channels to "zero" until all the channels have been initialized to the desired values. Once the initialization loop on the host VI is done sending the desired initial values to the target VI, and once it sets the "done initialization" Boolean to true, the FPGA PID VI output is "enabled".

Note that user input to the application (specifically, the host VI) is performed via the front panel of FIG. 4B. For example, note that the front panel includes data entry fields for the PID gains, output range, and setpoint (see upper left portion of the Figure), as well as initial values for these parameters (see lower left portion), among others. Note also that in this embodiment, graphical output for signal display is also facilitated by a graph or plot display (see upper right portion of the Figure).

Thus, in some embodiments, online configuration data may be passed from host computer 102 (via the host VI) to the PHE processing target 106 (or 104) (e.g., via a LabVIEW FPGA communication interface) without interrupting the PHE process(es) running independently. Thus, during execution of the application the user may dynamically change the configuration of the PID control algorithm.

It should be noted that many variations of the block diagrams of FIGS. 3 and 4A are possible, including updating multiple channel configurations per channel scan, and synchronized updates for all channels by passing in new configuration data for every channel during a single channel scan, among others.

The following describes various exemplary embodiments and examples of the present invention, including graphical programs created in the LabVIEW graphical programming development environment. It should be noted that the below examples are intended to be exemplary only, and are not intended to limit the form, appearance, or functionality to any particular set of features or attributes, or programming systems or technologies.

Figure 5:
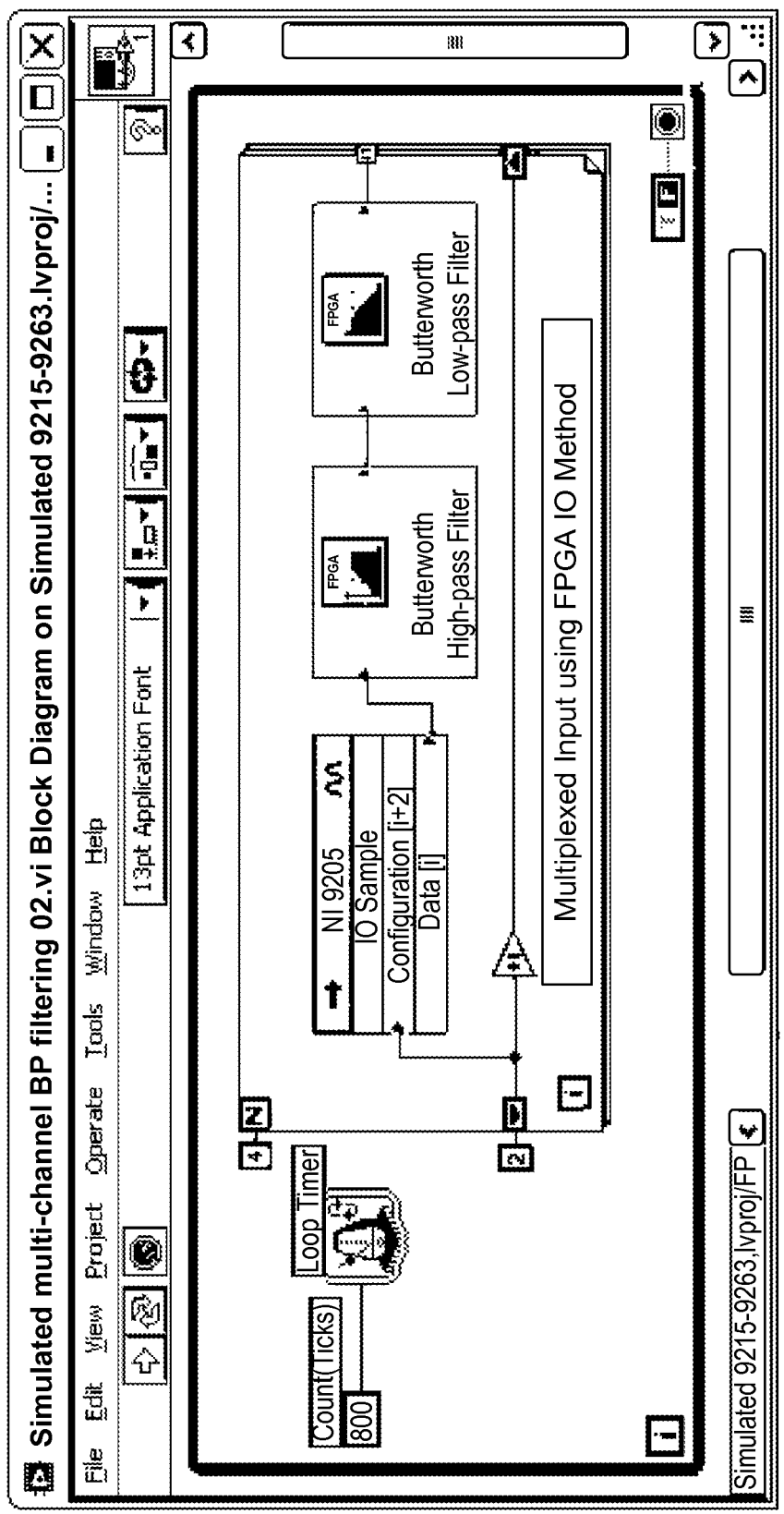
FIG. 5 illustrates two processing functions executing sequentially with scanned analog input.

FIG. 5—Exemplary Processing Functions

The following describes various exemplary applications of the above-described techniques, although it should be noted that these examples are exemplary only, and are not intended to limit the invention to any particular application domain, functionality, or form.

In some embodiments, the multi-channel processing paradigm may be integrated with "scan" I/O, e.g., as available with certain cRIO modules. FIG. 5 illustrates two processing functions executing sequentially with scanned analog input. Some cRIO modules provide a novel form of multiplexed I/O in which the channel to be sampled is requested programmatically in a pipelined fashion, such that the sampled data becomes available at the I/O function's output one or more calls later (see the I/O block labeled "NI 9205" in FIG. 5). The multi-channel graphical processing blocks may be effectively integrated into the multi-channel processing paradigm, resulting in an extremely efficient stream processing flow from input I/O to output I/O without requiring any user-constructed logic in the data path. This may be chosen as the preferred mode of operation when simultaneous sampling of all channels is not a requirement.

Figure 6:
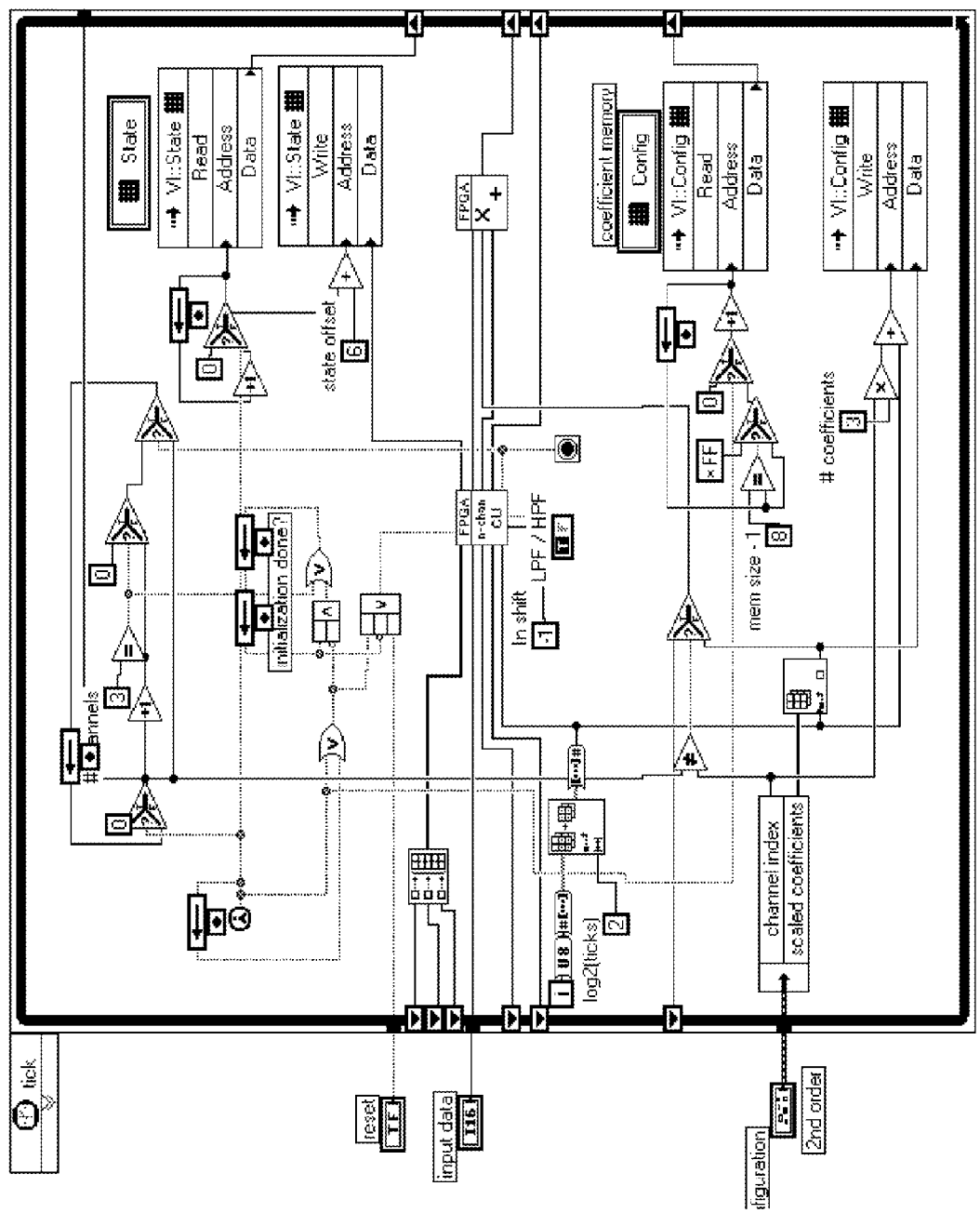
FIG. 6 illustrates one embodiment of a prototype implementation of a multi-channel IIR filter.

In one set of embodiments, the multi-channel architecture may be generalized, and multi-channel functions may be automatically generated from single-channel templates. One challenge in developing multi-channel architectures is organizing the channel and configuration memory storage in such a way as to minimize latency and/or resource usage. Many DSP (digital signal processing) operations have a fairly regular structure that may lend itself well to automating the code generation involved in converting a single-channel function to multiple channels while maintaining the online reconfiguration capability, which may require a random access memory in order to support the flexibility of the interface. FIG. 6 illustrates one embodiment of a prototype implementation of a multi-channel IIR filter. The same basic structure may be used as for a minimum resource implementation for 1st, 2nd, and 4th order IIR filters of various coefficient designs. State storage and retrieval may be separated from configuration data in order to support the asynchronous mechanism provided to allow configuration data to be updated via a (potentially) low-speed communication bus.

A single multiply-accumulate (MAC) unit may be shared among all channels, and may be accessed sequentially multiple times in processing a single channel. The control unit (CU) in the center may contain all routing logic required to exploit symmetries in filter coefficients and accommodate different state storage bit-packing schemes. Due to this regularity, code generation methods to automatically produce a diagram similar to that in FIG. 6 are possible and are contemplated. Such methods may feature as input a formal description of processing blocks performance requirements in a multi-channel system, containing one or more of the following parameters: maximum latency, minimum throughput, maximum resource usage (multipliers, block RAM, logic slices, etc.), state required to fully describe a single channel, and/or parameters requiring run-time reconfiguration.

In some embodiments, the input parameters themselves may be generated for individual function blocks based on a similar system-level description that fairly allocates resources among the processing functions comprising that system. Then, given one or more single-channel implementation templates for each processing function, the code generator may be configured to produce a multi-channel implementation that meets the criteria, if it is possible to do so.

One set of embodiments may include a PID algorithm that features what is known as bumpless transfer. Bumpless transfer may operate to eliminate transient effects at the PID output, when modifying the PID gains. This may require that the PID algorithm switch from one mode to another for one cycle. Given the fact that the PID gains that are sent to the PID VI on the PHE may correspond to a channel that is different than what the PID algorithm is currently processing, and given that the gain changes may occur asynchronously, the gain changes may need to be detected and applied appropriately. One straightforward approach to resolve this issue may be to configure two memory elements. The first memory element may contain all the PID configuration information (the PID gains) for the current sample-time and may be used for calculations. The second memory element may be configured to accept updated PID gains in "real time" as they arrive from the host, and may store them for later comparison and processing. Consequently, for any given channel the corresponding configuration information (PID gains) may be read from the two memory elements, compared against each other, and the PID algorithm may be switched as necessary if it has been determined that the gains have changed. However, this approach requires substantial memory resources, which may not be an effective use of the programmable hardware element, and may limit the number of channels that may be implemented.

Figure 7:
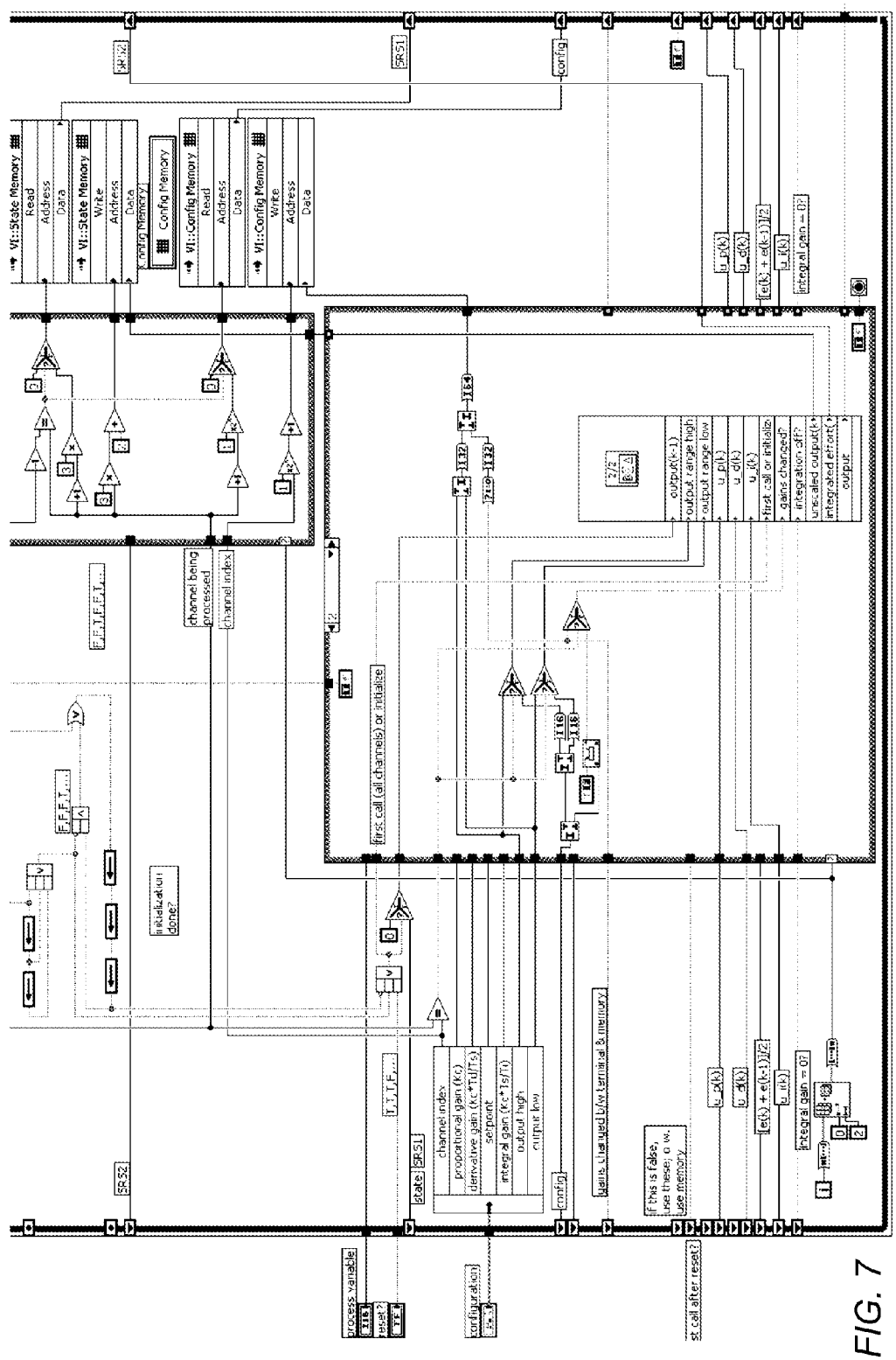
FIG. 7 illustrates implementation code for one embodiment of a bumpless multi-channel PID.

In one set of embodiments, proper handling of asynchronously occurring gain changes may be implemented by reducing the required memory block usage by a factor of two, while maintaining the bumpless transfer functionality. This may be accomplished by interleaving the PID gains comparison and application to be within the core algorithm cycles. In particular, in any given cycle, the PID algorithm may accept updated gains corresponding to any PID channel, read the corresponding gains that were stored (previously) for that particular channel from memory, compare the gains, and if the gains are different, set a Boolean flag (e.g., a bit) indicating that the gains have changed for this particular channel. It may subsequently overwrite the gains in memory with the new gains. Consequently, when it is this particular channel's turn for being processed, the algorithm may recognize that the gains for this channel have changed from the previous time-step based on examination of the Boolean flag and may apply the correct algorithm switch (e.g., for a single cycle), to effect the bumpless transfer, and reset the Boolean flag. Thus, depending on the value of the Boolean, the normal or the bumpless transfer algorithm may be invoked as needed, while not requiring the additional memory required to store two sets of PID gains for each channel. FIG. 7 illustrates one embodiment of the implementation code for bumpless multi-channel PID.

As previously mentioned, one example of a filtering implementation may include the design of IIR (infinite impulse response) filtering functionality. IIR filtering may be used for solving a difference equation of the form:

$$y(n)=b0*x(n)+b1*x(n-1)+b2*x(n-2)-a1*y(n-1)-a2*y(n-2). \quad (1)$$

Figure 8:
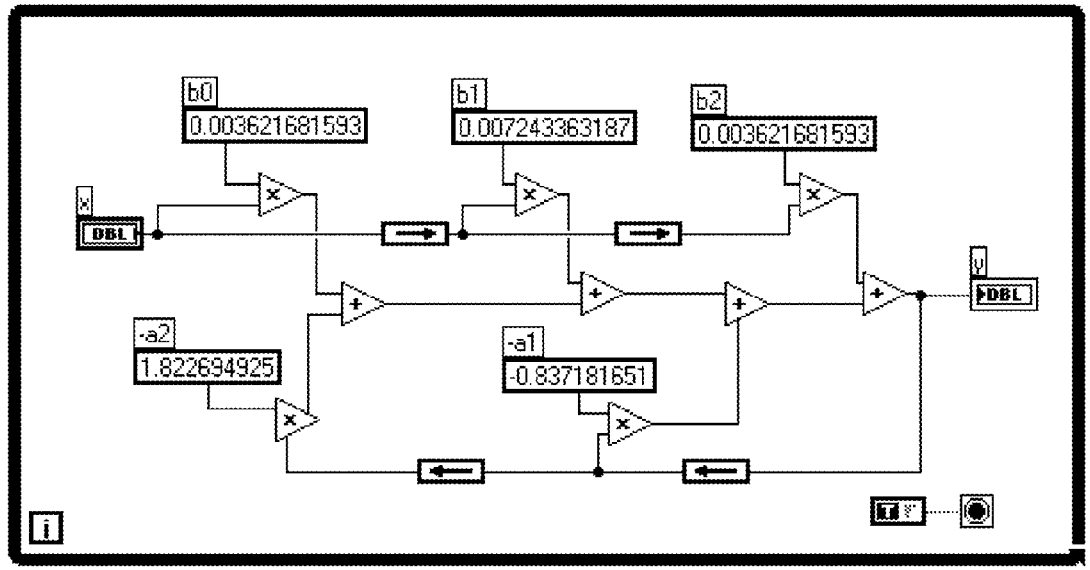
FIG. 8 illustrates a graphical program layout of an implementation of a direct $2^{nd}$ order infinite impulse response (IIR) filter.

FIG. 8 illustrates what a direct translation of this equation from a textbook into LabVIEW may look like, according to one embodiment. This direct translation would normally not be the most desirable form due to quantization issues and state storage requirements, but it may be used in some cases for a number of reasons that include:

the use of a conservative 32-bit width for coefficient storage, to reduce the issue of quantization maintaining a bit-true compatibility with previous implementations that also use direct translation compatibility with resource-sharing implementations in which sequential processing is performed through a single MAC unit capability of taking advantage of coefficient redundancies, which may result in excellent resource efficiency and reduce the issue of quantization.

Since the forward (Butterworth) coefficients in equation (1) above exhibit the structure $b1=2*b0=2*b2$, the difference equation (1) may be rewritten as:

$$y(n)=b0*[x(n)+2*x(n-1)+x(n-2)]-a1*y(n-1)-a2*y(n-2). \quad (2)$$

Figure 9:
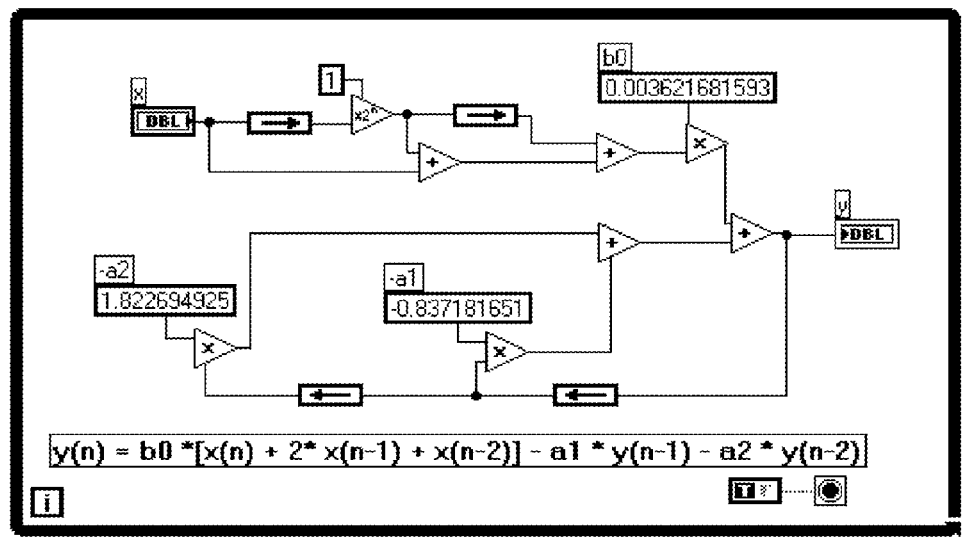
FIG. 9 illustrates the graphical program layout of the implementation of the direct $2^{nd}$ order IIR filter modified to remove redundant coefficients.

FIG. 9 illustrates the implementation of FIG. 8, modified according to equation (2), to save two multiplications. By visualizing the critical timing paths—assuming an SCTL (single cycle timed loop) implementation—and ascertaining what operations are taking place in parallel, then docking the shift registers and rearranging the diagram of FIG. 9 without breaking any wires, a critical path view of the filter may be obtained, as shown in FIG. 10.

Figure 10:
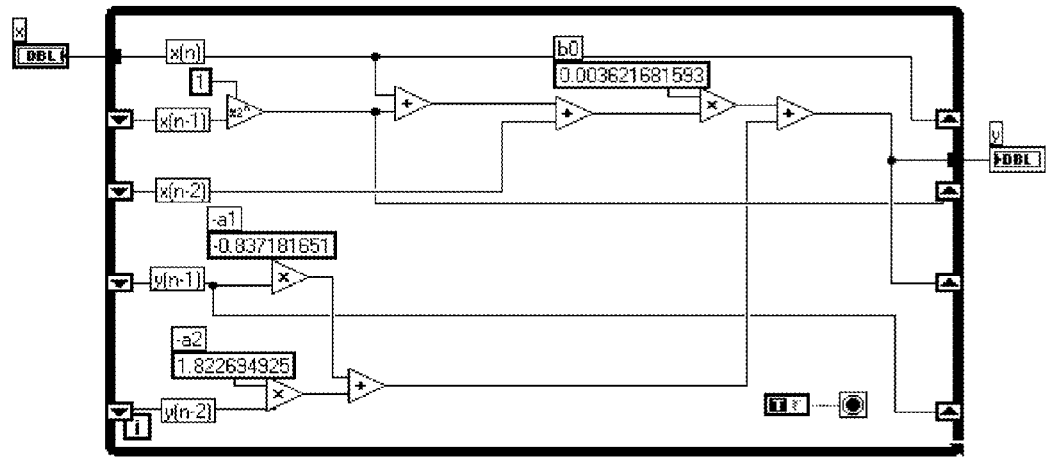
FIG. 10 illustrates the graphical program layout of the critical path view of the direct $2^{nd}$ order IIR filter.

As may be seen in FIG. 10, a long critical path may exist from x to y due to the forward coefficient modification, but it may be feasible to share the three multiply-add combinations by appropriately maintaining the states. Furthermore, the $x(n)+2*x(n-1)+x(n-2)$ sum may be computed in parallel with the multiplies, in order to avoid the long critical path. This may require a state machine architecture to manage routing the appropriate inputs to the MAC unit and a separate adder, as shown in FIG. 11.

Figure 11:
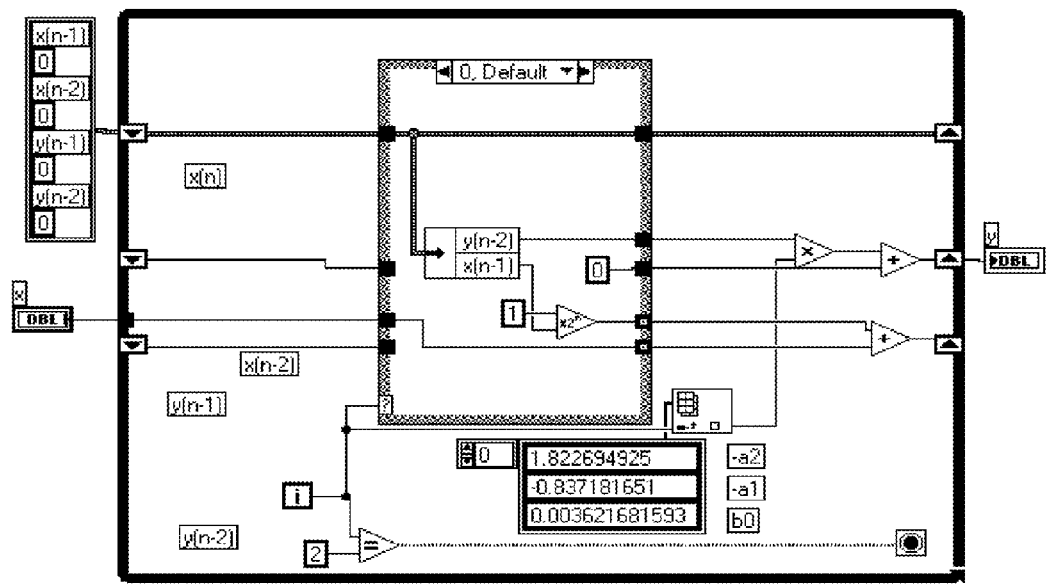
FIG. 11 illustrates the graphical program layout of a pipelined minimum resource implementation of the $2^{nd}$ order IIR filter.
Figure 12:
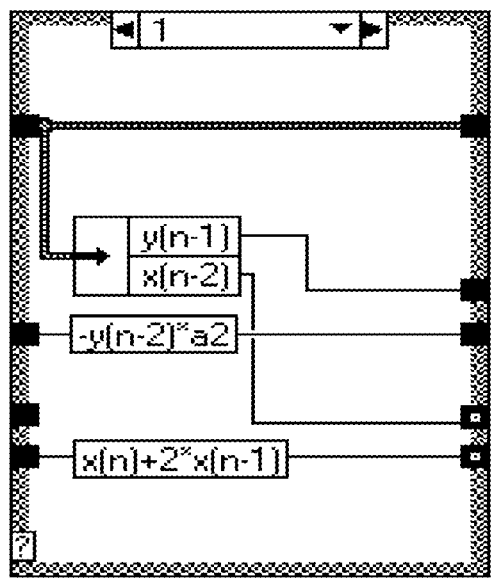
FIG. 12 illustrates the graphical program layout of the second iteration in the implementation of the $2^{nd}$ order IIR filter.
Figure 13:
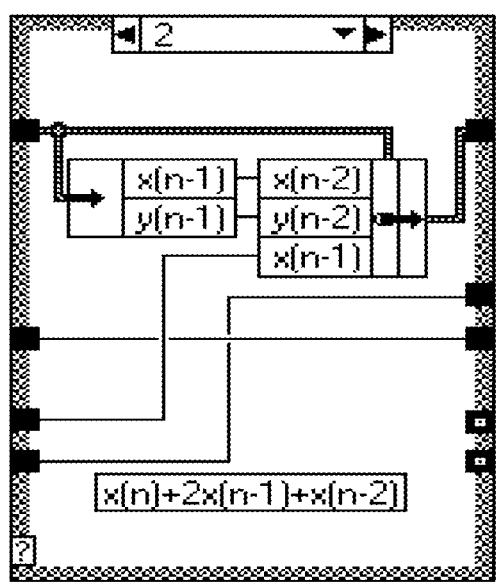
FIG. 13 illustrates the graphical program layout of the third iteration in the implementation of the $2^{nd}$ order IIR filter.

As may be seen in FIG. 11, the four "state" shift registers may be gathered into a cluster, and two new registers may be added, which may serve to reduce the critical path as well as to pass intermediate data between loop iterations. The multi-plication of $y(n-2)*a2$ and addition of $x(n)+2*x(n-1)$ may be performed in the first iteration, and the results may be stored in the new shift registers. One embodiment of the second iteration, shown in FIG. 12, may include the multiplication $y(n-1)*a1$, and the addition of $x(n-2)$ to the previous addition result. In one embodiment of the subsequent (i.e. third) iteration, shown in FIG. 13, the combined x values may be passed through to be multiplied by b0 and added to the running accumulate total. All state values may be shifted to the next delay slot in preparation for the next input point.

Figure 14:
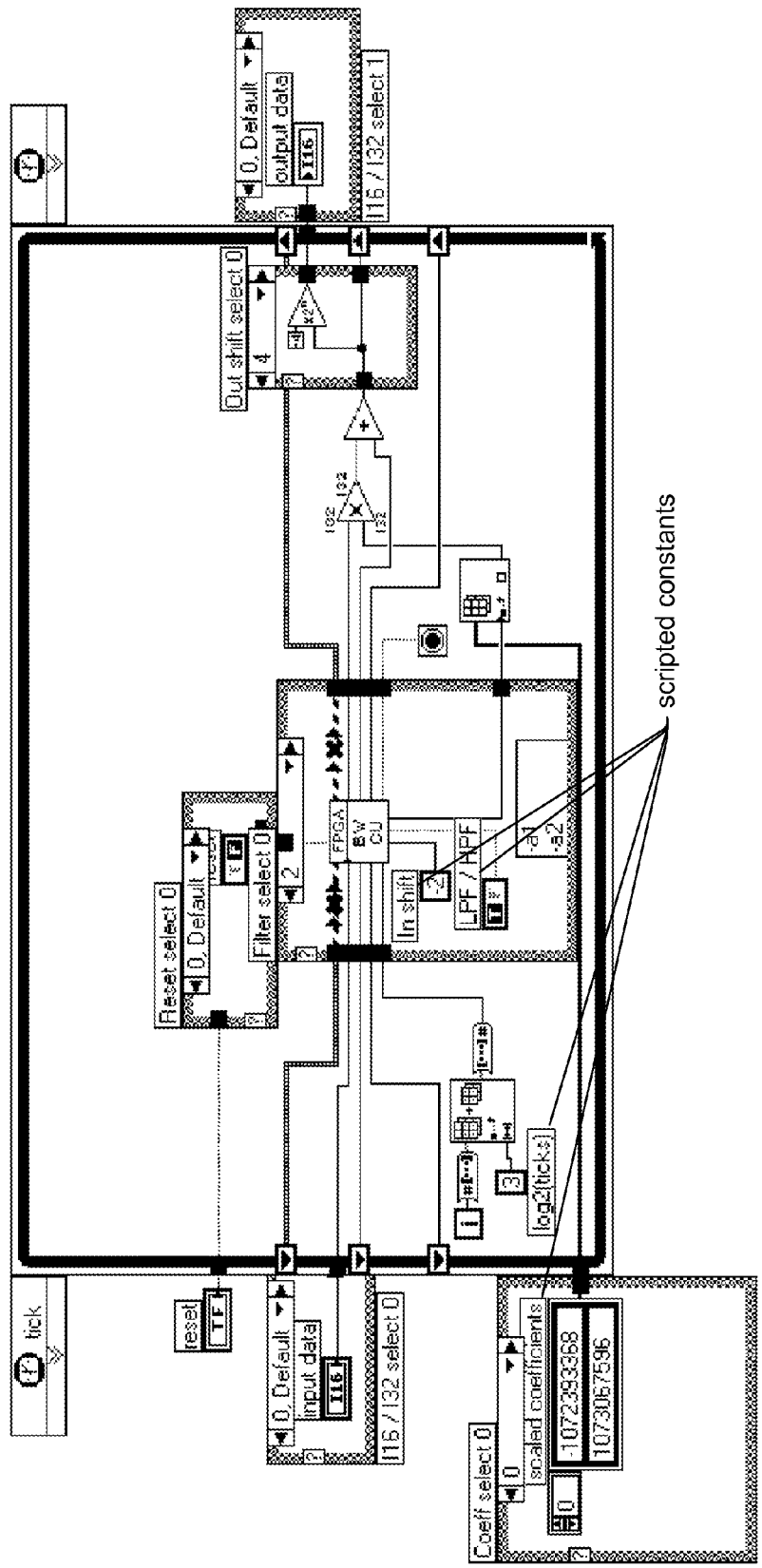
FIG. 14 illustrates the graphical program layout of the implementation of $1^{st}$, $2^{nd}$, and $4^{th}$ order filters for 16, 24, or 32 bit inputs using a common single channel template.

The conversion to integer implementation and different filter orders may be accomplished by applying a scaling to the implementation shown above. A thusly obtained implementation may differ somewhat from the floating-point implementation discussed above; however, the amount of state storage may be reduced from 4 to 3 elements by sharing storage locations efficiently. FIG. 14 illustrates the implementation of 1st, 2nd, and 4th order filters for 16, 24, or 32 bit inputs using a common single-channel template. Each case of the Filter Select 0 case structure may contain a different polymorphic control unit to handle routing of the state properly. The case structures may be removed during the scripting process by the code generator engine. Some of the constants in the program may also be scripted during that process, as indicated in the figure by the label "scripted constants". The "Out shift select 0" case structure may contain custom saturating shifters for various shift amounts and output widths (32 or 16 bits). These may be individually created because the internal fixed-size Boolean arrays may not allow passing in a shift via the connector pane without breaking the subVI. In some embodiments, this may be configured as an instance of a VI to avoid having to provide multiple subVIs and to avoid the possibility of having to rely on them as an API.

The common template shown in FIG. 14 may be used to implement a 2nd order notch filter. Even though the coefficients of the notch filter may have a different exploitable structure than that of a Butterworth filter, the architecture may be configured to address this issue inside the control unit. The coefficient relationships of interest for the notch filter are $b0=b2$, and $b1=-a1$, resulting in a difference equation of:

$$y(n)=b0*[x(n)+x(n-2)]+b1*[x(n-1)-y(n-1)]-a2*y(n-2). \quad (3)$$

Only three coefficients may need to be passed on to the PHE: b0, b1, and $-a2$. The extra adder may be used to add/subtract the state values before multiplying by b0 and b1. In this case, the $a2*y(n-2)$ multiplication may need to take place first since the addition or subtraction results may not be ready until the second loop iteration.

As previously mentioned, it is desired for multiple channels to share a single filter resource among all the channels, and to move the state storage from shift registers into block RAM, such that there is no additional logic cost (other than time) to process an extra channel. Since time becomes the limiting factor in channel count, it may also be desirable to minimize the latency as much as possible without going to a fully parallel implementation. Future embodiments in which a user may use N separate loops to process N channels (assuming N is greater than 6 or so channels) are possible and are contemplated. Through the use of multipliers, users may obtain flexibility in using a small number of separate loops to handle requirements for independent loop rates. For example, some embodiments may feature 3-5 separate loops, each containing a PID and two filters, with multiplier usage constrained accordingly. PID may be performed in parallel with 3 multipliers, but the filters may only use one multiplier each.

Figure 15:
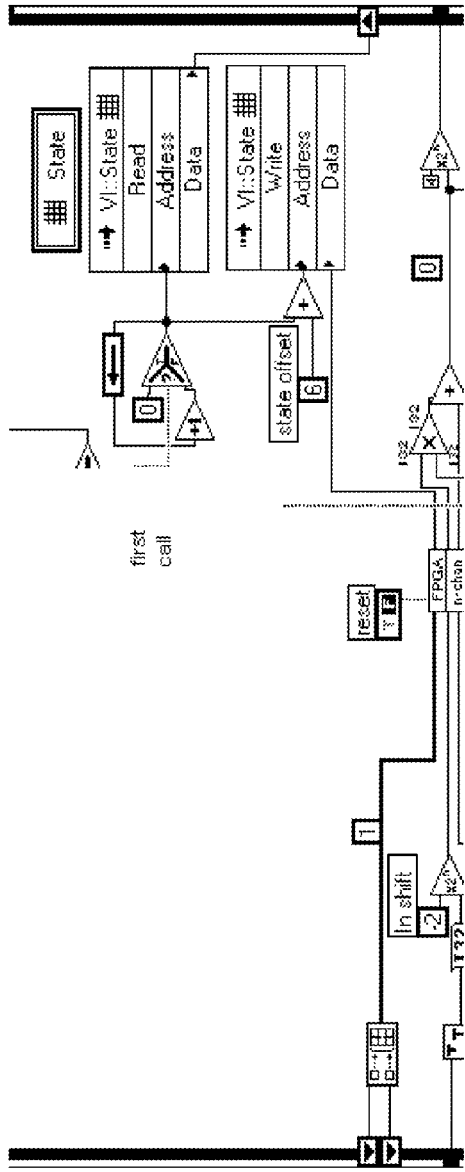
FIG. 15 illustrates the graphical program layout of the state addressing and buffering for a multi-channel implementation of filter functions.

FIG. 15 illustrates the graphical program layout of state addressing and buffering for a multi-channel implementation of filter functions, according to one embodiment. State information may be stored in a memory element, e.g. a 256 element memory block with 64-bit width, to allow all state information to be read/written in the number of cycles (in this case 3 cycles) it takes the filter itself to execute. Accesses may be pipelined to minimize additional shift register requirements by reading only as needed when possible, and by writing state information back to memory as soon as it is available. A double shift register may be added to buffer the state since all the information may be required in the first two iterations of the filter loop. The second and third iteration memory reads may actually be preloading states for the next channel.

In one set of embodiments, the address counter may be a simple 8-bit rollover counter implementing a rotating circular buffer utilizing all 256 elements of memory. Only the offset between the read and write addresses may need to be taken into consideration, in this case given by $(N-1)*3$, where N is the number of channels and 3 is the number of memory elements per channel. Initialization (not configured in the embodiment shown in FIG. 15) may be handled inside the control unit with a multiplexer.

Storing reconfigurable per-channel filter coefficients may require that any channel's coefficients may be input via the configuration terminal on any call to the VI. Therefore, it may be required that the location of a channel's memory space be known at all times. This may be accomplished by using a fixed section of memory rather than the rotating circular buffer scheme described above. Since the respective amounts of configuration and state information don't necessarily have to match in the general case, two independent memory blocks and address counters may be used for storing state information and coefficients.

Figure 16:
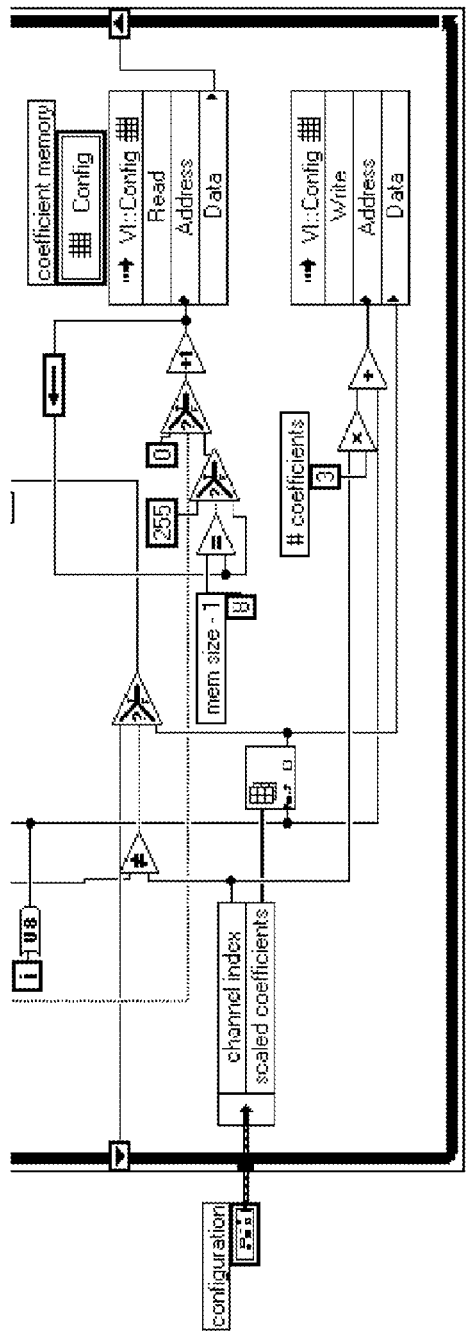
FIG. 16 illustrates the graphical program layout of the coefficient storage addressing for a multi-channel implementation of filter functions.

Since the address counter may be a non-power-of 2 in this case, the last address may need to be detected and the counter reset to zero. In addition, on the first call reading may be started at address 1 instead of address 0 since at that point the coefficient is being read for the second iteration. This may require a second reset multiplexer, as shown in FIG. 16.

The computation of the write address may simply be the input channel index multiplied by the number of coefficients (technically, the number of memory elements) per channel, with an offset given by the iteration number. This may not require a built-in multiplier. It should be noted that if the channel index in the configuration input corresponds to the channel currently being processed, the coefficient preloaded from memory may be bypassed by performing a comparison and using a multiplexer, in order to use the one from the terminal. Alternate embodiments may be configured to not apply the coefficient until the next time the channel comes up, which may reduce the required amount of logic for implementation. It should also be noted that scaled coefficients may be written immediately to memory when received, regardless of the relationship between channel index and the currently processed channel. In some embodiments, the design may be simplified by configuring the program to wait until the current channel matches the channel index before applying the coefficients to memory, at the expense of possible unnecessary restrictions.

Figure 17:
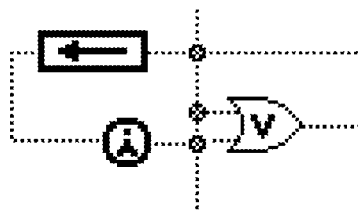
FIG. 17 illustrates the graphical program layout of the implementation of a two-cycle First Call signal.
Figure 18:
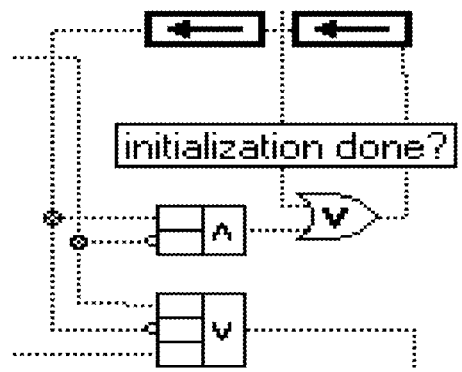
FIG. 18 illustrates the graphical program layout of the implementation of a channel scan reset signal fed by the two-cycle First Call signal of FIG. 10.

In order to reset the filter, a signal may be generated to hold the reset high on first call until the first channel scan is within one clock cycle of completion. The first call may be placed inside the loop to avoid an extra cycle of latency, required logic to hold the first call for an extra cycle to allow uninitialized shift registers (USRs) to flush before it drops (see FIGS. 17 and 18). The design may forego the use of initialized SRs (set-reset latches), to avoid the cycle of latency they entail.

Figure 19:
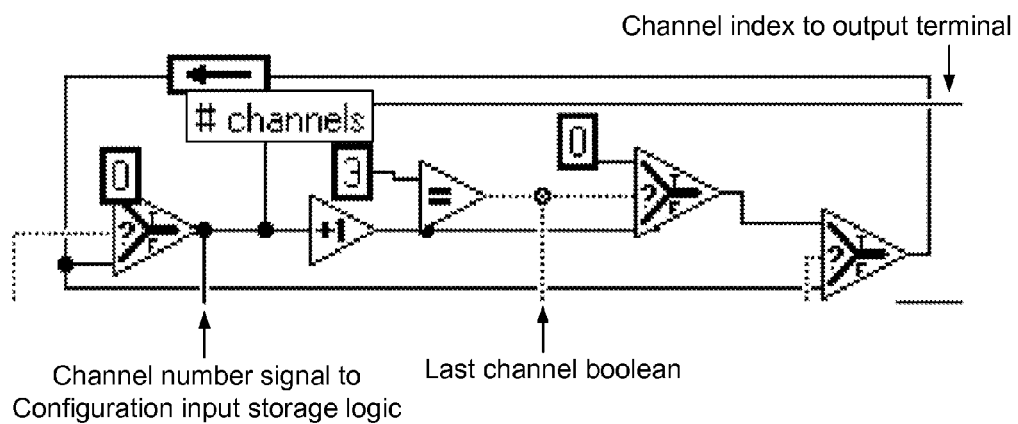
FIG. 19 illustrates the graphical program layout of the implementation of a channel counter.

The channel counter shown in FIG. 19 may feed the output channel index as well as the scan reset signal and, for reconfigurable filters, the coefficient storage. Since the end of channel scan Boolean may go high at the beginning of the last channel, the second feedback node in FIG. 18 may be required to delay the reset signal from dropping too soon. This counter may require two multiplexers, one for rollover and one for reset on first call.

FIG. 20—Table of Exemplary Performance Results

FIG. 20 is a table indicating exemplary results regarding improved performance due to the techniques described herein, according to one embodiment. More specifically, the table shows a benchmark of a prior art PID control on an FPGA, labeled "Legacy FPGA PID", compared to a PID control according to one embodiment of the present invention, labeled "New FPGA PID", where the FPGA is a 3 million gate FPGA. As the table indicates, with the legacy PID no more than 8 PID loops (channels) can be implemented before running out of resources (slices). However, with the new PID, as many as 256 PID loops may be implemented (and possibly more, depending upon memory constraints) while using only 30% of the FPGA resources. Note that this corresponds to a 32-fold improvement over the prior art. Note further that the remaining free 70% may be used for other custom algorithms, such as filtering. Thus, embodiments of the present invention may facilitate substantial improvements in utilization of programmable hardware resources, e.g., gates, and may thus free up resources for other uses, e.g., filters, etc.

Thus, various embodiments of the above systems and methods may facilitate a multi-channel PID control and filtering programmable hardware element architecture.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

We claim:

1. A method comprising:
   specifying a hardware configuration program, wherein the hardware configuration program comprises a processing function, wherein said specifying comprises:
     specifying inputs and outputs of the processing function, wherein the processing function comprises one or more filters;
     specifying a plurality of channels; and
     specifying channel scanning functionality for the plurality of channels;
   configuring a programmable hardware element with the hardware configuration program, wherein said configuring comprises:
     implementing the processing function and the channel scanning functionality on the programmable hardware element;

storing a respective state and configuration of each of the plurality of channels in a memory of the programmable hardware element, wherein said storing enables logic-sharing between each of the plurality of channels; and operating the programmable hardware element, wherein said operating comprises:

performing channel scanning on the plurality of channels; and updating the configuration information for one or more of the channels in the memory of the programmable hardware element without interrupting the channel scanning, without taking any of the channels offline, and/or without interrupting a continuity of an output of the programmable hardware element.

2. The method of claim 1, wherein said specifying a hardware configuration program comprises:

creating a graphical program that specifies functionality of the hardware configuration program, wherein the graphical program comprises a plurality of interconnected nodes that visually represent functionality of the graphical program; and generating the hardware configuration program based on the graphical program.

3. A method, comprising:

specifying a hardware configuration program, wherein the hardware configuration program comprises a processing function, wherein said specifying comprises:

specifying inputs and outputs of the processing function;

specifying a plurality of channels; and specifying channel scanning functionality for the plurality of channels;

configuring a programmable hardware element with the hardware configuration program, wherein said configuring comprises:

implementing the processing function and the channel scanning functionality on the programmable hardware element;

storing a respective state and configuration of each of the plurality of channels in a memory of the programmable hardware element, wherein said storing enables logic-sharing between each of the plurality of channels; and operating the programmable hardware element, wherein said operating comprises:

performing channel scanning on the plurality of channels; and updating the configuration information for one or more of the channels in the memory of the programmable hardware element without interrupting the channel scanning, without taking any of the channels offline, and/or without interrupting a continuity of an output of the programmable hardware element;

creating a second program, wherein the second program is executable on a host computer coupled to the programmable hardware element to provide updated configuration information for the one or more channels at runtime; and wherein said updating the configuration information for the one or more of the channels comprises:

executing the second program on the host computer system concurrently with operation of the programmable hardware element, wherein said executing comprises the second program providing the updated configuration information for the one or more channels to the programmable hardware element.

4. The method of claim 3, wherein the second program implements a graphical user interface (GUI) for the programmable hardware element;

wherein said updating the configuration information further comprises:

receiving user input to the GUI specifying the updated configuration information for the one or more channels; and wherein said providing for the processing function to the programmable hardware element comprises:

the second program providing the specified updated configuration information for the one or more channels to the programmable hardware element; and wherein said updating the configuration information for one or more of the channels is performed based on the updated configuration information.

5. A method, comprising:

specifying a hardware configuration program, wherein the hardware configuration program comprises a processing function, wherein said specifying comprises:

specifying inputs and outputs of the processing function, wherein the processing function comprises a PID (proportional-integral-derivative) control function;

specifying a plurality of channels; and specifying channel scanning functionality for the plurality of channels;

configuring a programmable hardware element with the hardware configuration program, wherein said configuring comprises:

implementing the processing function and the channel scanning functionality on the programmable hardware element;

storing a respective state and configuration of each of the plurality of channels in a memory of the programmable hardware element, wherein said storing enables logic-sharing between each of the plurality of channels; and operating the programmable hardware element, wherein said operating comprises:

performing channel scanning on the plurality of channels; and updating the configuration information for one or more of the channels in the memory of the programmable hardware element without interrupting the channel scanning, without taking any of the channels offline, and/or without interrupting a continuity of an output of the programmable hardware element.

6. The method of claim 5, wherein the configuration information for each channel comprises PID gains for the channel;

wherein said updating the configuration information for one or more of the channels comprises:

receiving updated PID gains for a channel;

comparing the updated PID gains with stored PID gains for the channel;

if the updated PID gains for the channel are different from the stored PID gains:

set a Boolean indicating that the updated PID gains for the channel are different from the stored PID gains; and overwrite the stored PID gains for the channel with the updated PID gains;

wherein said performing channel scanning comprises:
when scanning the channel, in response to the Boolean indicating that the updated PID gains for the channel are different from the stored PID gains:
performing a bumpless transfer for the channel; and
resetting the Boolean.

7. A system, comprising:
a programmable hardware element (PHE) configured with:
a processing function having inputs and outputs, wherein the processing function comprises a PID (proportional-integral-derivative) control function;
a plurality of channels corresponding to the inputs and outputs;
channel scanning functionality for the plurality of channels; and
a memory configured to store respective state and configuration information for each of the plurality of channels, wherein the stored state and configuration information enables logic-sharing between each of the plurality of channels;
wherein the PHE is configured to:
perform channel scanning on the plurality of channels;
receive updated configuration information for one or more of the channels; and
update the configuration information for the one or more of the channels in the memory of the programmable hardware element without interrupting the channel scanning, without taking any of the channels offline, and/or without interrupting a continuity of an output of the programmable hardware element.

8. A system, comprising:
a programmable hardware element (PHE) configured with:
a processing function having inputs and outputs;
a plurality of channels corresponding to the inputs and outputs;
channel scanning functionality for the plurality of channels; and
a memory configured to store respective state and configuration information for each of the plurality of channels, wherein the stored state and configuration information enables logic-sharing between each of the plurality of channels;
a host computer, communicatively coupled to the PHE, wherein the host computer comprises a processor and memory, and wherein the memory stores a program executable by the processor to update the configuration information for the channels on the PHE;
wherein the PHE is configured to:
perform channel scanning on the plurality of channels;
receive updated configuration information for one or more of the channels; and
update the configuration information for the one or more of the channels in the memory of the programmable hardware element without interrupting the channel scanning, without taking any of the channels offline, and/or without interrupting a continuity of an output of the programmable hardware element;
wherein, to update the configuration information, the system is configured to execute the program on the host computer concurrently with operation of the programmable hardware element to provide the updated configuration information for one or more of the channels to the PHE at run-time.

9. The system of claim 8,
wherein the program implements a graphical user interface (GUI) for the PHE, and wherein, to update the configuration information for the processing function in the configuration memory element, the system is configured to:
receive user input to the GUI specifying the updated configuration information; and
provide the updated configuration information to the programmable hardware element.

10. A system, comprising:
a programmable hardware element (PHE) configured with:
a processing function having inputs and outputs, wherein the processing function comprises one or more filters;
a plurality of channels corresponding to the inputs and outputs;
channel scanning functionality for the plurality of channels; and
a memory configured to store respective state and configuration information for each of the plurality of channels, wherein the stored state and configuration information enables logic-sharing between each of the plurality of channels;
wherein the PHE is configured to:
perform channel scanning on the plurality of channels;
receive updated configuration information for one or more of the channels; and
update the configuration information for the one or more of the channels in the memory of the programmable hardware element without interrupting the channel scanning, without taking any of the channels offline, and/or without interrupting a continuity of an output of the programmable hardware element.

11. The system of claim 7,
wherein the configuration information for each channel comprises PID gains for the channel;
wherein to update the configuration information for the one or more of the channels, the system is configured to:
receive updated PID gains for a channel;
compare the updated PID gains with stored PID gains for the channel;
if the updated PID gains for the channel are different from the stored PID gains:
set a Boolean indicating that the updated PID gains for the channel are different from the stored PID gains; and
overwrite the stored PID gains for the channel with the updated PID gains;
wherein to perform channel scanning the system is configured to:
when scanning the channel, in response to the Boolean indicating that the updated PID gains for the channel are different from the stored PID gains:
perform a bumpless transfer for the channel; and
reset the Boolean.

12. A system, comprising:
means for specifying a hardware configuration program, wherein the hardware configuration program comprises a processing function, wherein said specifying comprises:
specifying inputs and outputs of the processing function;
specifying a plurality of channels; and
specifying channel scanning functionality for the plurality of channels;
means for configuring a programmable hardware element with the hardware configuration program, wherein said configuring comprises:

implementing the processing function and the channel scanning functionality on the programmable hardware element;

storing a respective state and configuration of each of the plurality of channels in a memory of the programmable hardware element, wherein said storing enables logic-sharing between each of the plurality of channels; and means for operating the programmable hardware element, wherein said operating comprises:

performing channel scanning on the plurality of channels; and updating the configuration information for one or more of the channels in the memory of the programmable hardware element without interrupting the channel scanning, without taking any of the channels offline, and/or without interrupting a continuity of an output of the programmable hardware element;

means for creating a second program, wherein the second program is executable on a host computer coupled to the programmable hardware element to provide updated configuration information for the one or more channels at run-time; and wherein said updating the configuration information for the one or more of the channels comprises:

executing the second program on the host computer system concurrently with operation of the programmable hardware element, wherein said executing comprises the second program providing the updated configuration information for the one or more channels to the programmable hardware element.

13. The system of claim 12, wherein said means for specifying a hardware configuration program comprises:

means for creating a graphical program that specifies functionality of the hardware configuration program, wherein the graphical program comprises a plurality of interconnected nodes that visually represent functionality of the graphical program; and means for generating the hardware configuration program based on the graphical program.

14. The system of claim 12, wherein the second program implements a graphical user interface (GUI) for the programmable hardware element;

wherein said updating the configuration information further comprises:

receiving user input to the GUI specifying the updated configuration information for the one or more channels; and wherein said providing for the processing function to the programmable hardware element comprises:

the second program providing the specified updated configuration information for the one or more channels to the programmable hardware element; and wherein said updating the configuration information for one or more of the channels is performed based on the updated configuration information.

15. A system, comprising:

means for specifying a hardware configuration program, wherein the hardware configuration program comprises a processing function, wherein said specifying comprises:

specifying inputs and outputs of the processing function, wherein the processing function comprises one or more filters;

specifying a plurality of channels; and specifying channel scanning functionality for the plurality of channels;

means for configuring a programmable hardware element with the hardware configuration program, wherein said configuring comprises:

implementing the processing function and the channel scanning functionality on the programmable hardware element;

storing a respective state and configuration of each of the plurality of channels in a memory of the programmable hardware element, wherein said storing enables logic-sharing between each of the plurality of channels; and means for operating the programmable hardware element, wherein said operating comprises:

performing channel scanning on the plurality of channels; and updating the configuration information for one or more of the channels in the memory of the programmable hardware element without interrupting the channel scanning, without taking any of the channels offline, and/or without interrupting a continuity of an output of the programmable hardware element.

16. A system, comprising:

means for specifying a hardware configuration program, wherein the hardware configuration program comprises a processing function, wherein said specifying comprises:

specifying inputs and outputs of the processing function, wherein the processing function comprises a PID (proportional-integral-derivative) control function;

specifying a plurality of channels; and specifying channel scanning functionality for the plurality of channels;

means for configuring a programmable hardware element with the hardware configuration program, wherein said configuring comprises:

implementing the processing function and the channel scanning functionality on the programmable hardware element;

storing a respective state and configuration of each of the plurality of channels in a memory of the programmable hardware element, wherein said storing enables logic-sharing between each of the plurality of channels; and means for operating the programmable hardware element, wherein said operating comprises:

performing channel scanning on the plurality of channels; and updating the configuration information for one or more of the channels in the memory of the programmable hardware element without interrupting the channel scanning, without taking any of the channels offline, and/or without interrupting a continuity of an output of the programmable hardware element.

17. The system of claim 16, wherein the configuration information for each channel comprises PID gains for the channel;

wherein said updating the configuration information for one or more of the channels comprises:
  receiving updated PID gains for a channel;
  comparing the updated PID gains with stored PID gains for the channel;
  if the updated PID gains for the channel are different from the stored PID gains:
    set a Boolean indicating that the updated PID gains for the channel are different from the stored PID gains; and
    overwrite the stored PID gains for the channel with the updated PID gains;
wherein said performing channel scanning comprises:
  when scanning the channel, in response to the Boolean indicating that the updated PID gains for the channel are different from the stored PID gains:
    performing a bumpless transfer for the channel; and
    resetting the Boolean.

* * * * *